(12) United States Patent
Wieland et al.

(10) Patent No.: US 8,258,484 B2
(45) Date of Patent: Sep. 4, 2012

(54) BEAMLET BLANKER ARRANGEMENT

(75) Inventors: Marco Jan Jaco Wieland, Delft (NL); Alexander Hendrik Vincent Van Veen, Rotterdam (NL)

(73) Assignee: Mapper Lithography IP B.V., Delft (NL)

( * ) Notice: Subject to any disclaimer, the term of this patent is extended or adjusted under 35 U.S.C. 154(b) by 0 days.

(21) Appl. No.: 12/905,131

(22) Filed: Oct. 15, 2010

(65) Prior Publication Data

US 2012/0091318 A1    Apr. 19, 2012

Related U.S. Application Data

(63) Continuation of application No. PCT/EP2009/054468, filed on Apr. 15, 2009.

(60) Provisional application No. 61/045,243, filed on Apr. 15, 2008.

(51) Int. Cl.
*H01J 37/147* (2006.01)
*H01J 37/244* (2006.01)
*H01J 3/26* (2006.01)
*G01J 1/42* (2006.01)

(52) U.S. Cl. .......... 250/396 R; 250/208.2; 250/398; 250/306; 250/307; 250/492.2

(58) Field of Classification Search .......... 250/396 R, 250/398, 306, 307, 208.2, 492.2
See application file for complete search history.

(56) References Cited

U.S. PATENT DOCUMENTS

| | | | |
|---|---|---|---|
| 5,905,267 A | 5/1999 | Muraki | |
| 6,014,200 A | 1/2000 | Sogard | |
| 6,617,587 B2 * | 9/2003 | Parker et al. | 250/398 |
| 2003/0155534 A1 | 8/2003 | Platzgummer | |
| 2004/0119021 A1 | 6/2004 | Parker | |
| 2011/0260040 A1 * | 10/2011 | Wieland et al. | 250/208.2 |
| 2012/0091358 A1 * | 4/2012 | Wieland et al. | 250/396 R |

FOREIGN PATENT DOCUMENTS

| | | |
|---|---|---|
| EP | 1432009 A1 | 6/2004 |
| EP | 1453076 A | 9/2004 |
| JP | 2008027965 A | 2/2008 |
| WO | 01/35165 A | 5/2001 |

OTHER PUBLICATIONS

International Search Report for PCT/EP2009/054468 (issued Oct. 19, 2009).
Yasuda, Fast Electron Beam Lithography System with 1024 Beams Individually Controlled by Blanking Aperture Array (Abstract of the full article), Jpn. J. Appl. Phys. vol. 32 (1993), Part 1, No. 12B, pp. 6012-6017, Japan.
Dutch Search report for NL 2002031 (issued Jun. 18, 2009).

* cited by examiner

*Primary Examiner* — Nikita Wells
(74) *Attorney, Agent, or Firm* — Hoyng Monegier LLP; David P. Owen; Caroline J. Haitjema

(57) ABSTRACT

The invention relates to a charged particle multi-beamlet lithography system for exposing a target using a plurality of beamlets. The system has a beam generator, a beamlet blanker, and a beamlet projector. The beam generator is configured to generate a plurality of charged particle beamlets. The beamlet blanker is configured to pattern the beamlets. The beamlet projector is configured to project the patterned beamlets onto the target surface. The system further has a deflection device. The deflection device has a plurality of memory cells. Each memory cell is provided with a storage element and is connected to a switching electrode of a deflector.

19 Claims, 10 Drawing Sheets

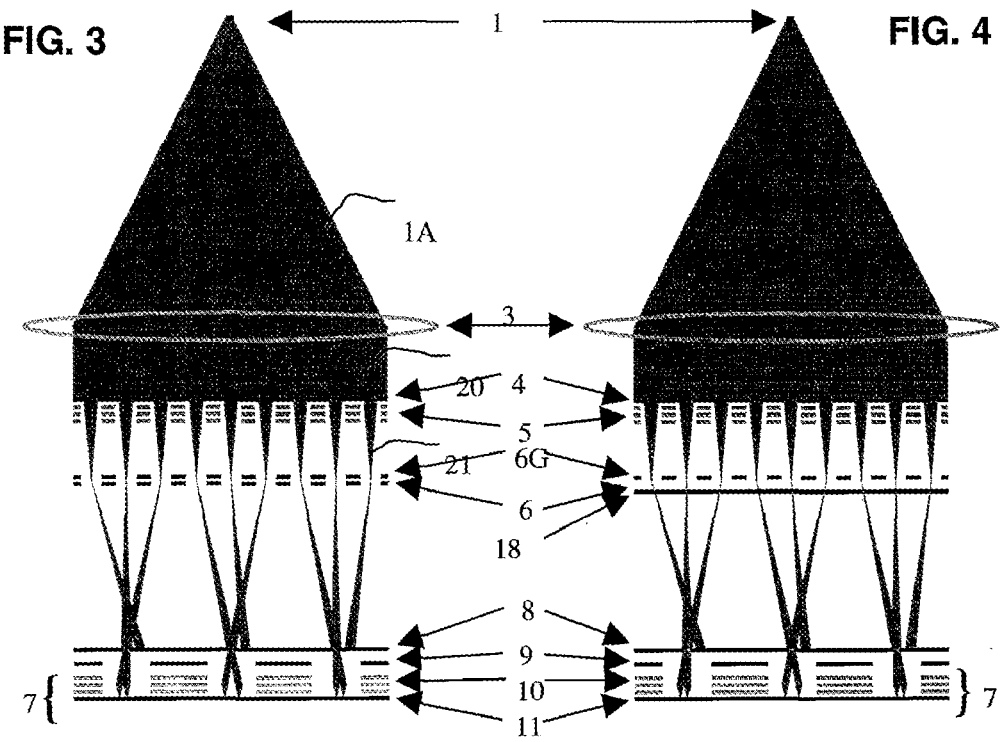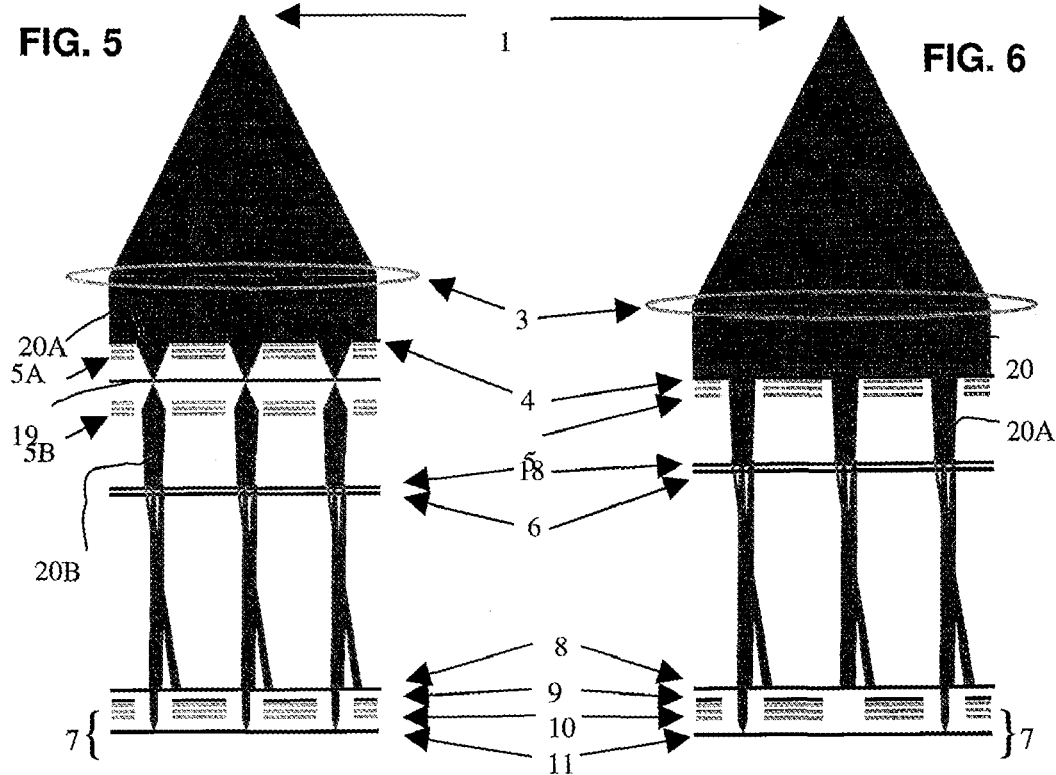

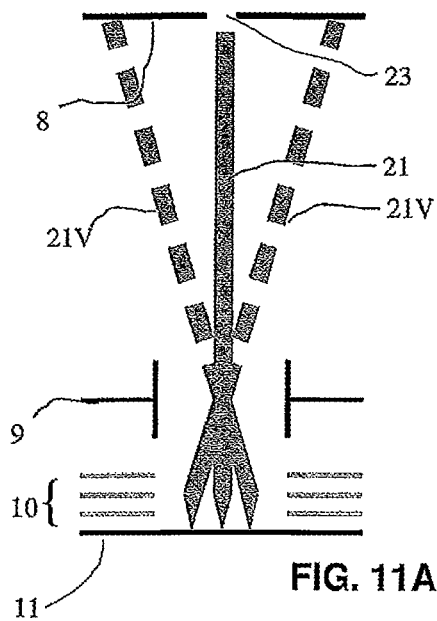
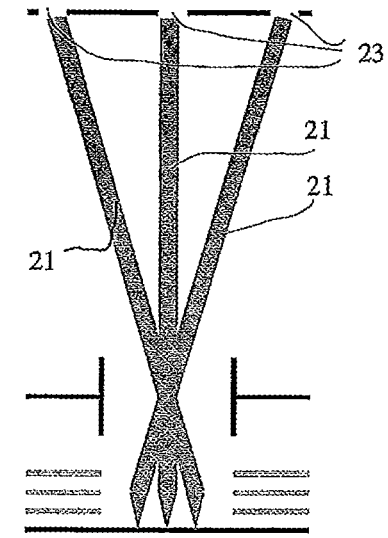
FIG. 11A
FIG. 11B
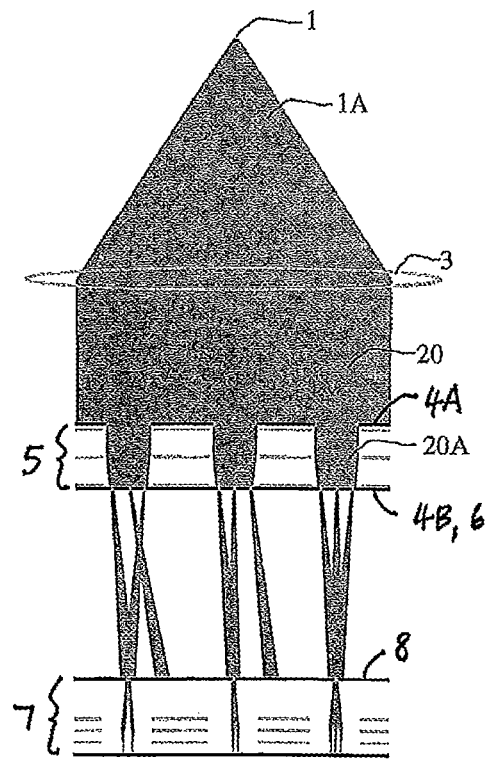
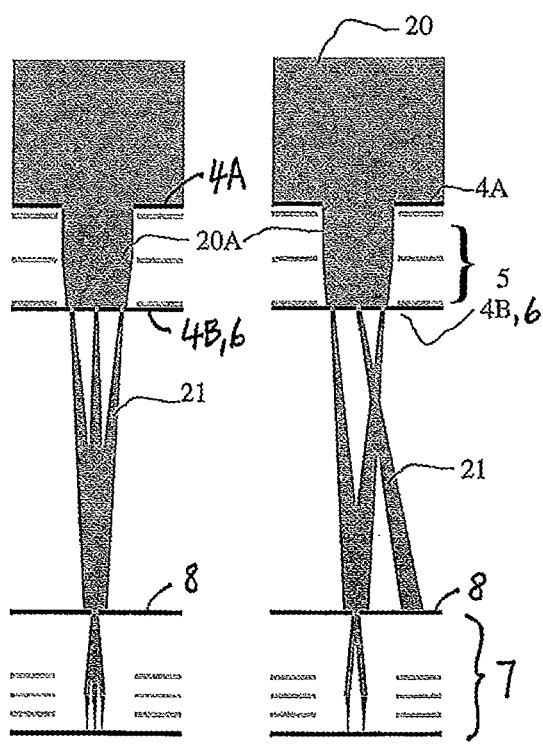
FIG. 12
FIG. 12A
FIG. 12B

BEAMLET BLANKER ARRANGEMENT

BACKGROUND OF THE INVENTION

1. Field of the Invention

The present invention relates to a projection system for a charged particle multi-beamlet system, such as for a charged particle multi-beamlet lithography system or an inspection system, and an end module for such a projection system.

The present invention more specifically relates to a deflection device, in particular a beamlet blanker for use in a charged particle multi-beamlet lithography system, the blanker comprising a substrate provided with apertures and deflectors with a first electrode and a second electrode arranged around an aperture, the deflectors receiving electrical signals for deflecting beamlets of charged particles passing through the apertures.

The present invention further relates to a charged particle multi-beamlet lithography system, to a deflecting method and a method of transferring a pattern to a target surface.

2. Description of the Related Art

Currently, most commercial lithography systems use a mask as a means to store and reproduce the pattern data for exposing a target, such as a wafer with a coating of resist. In a maskless lithography system, beamlets of charged particles are used to write the pattern data onto the target. The beamlets are individually controlled, for example by individually switching them on and off, to generate the required pattern.

One type of design used for charged particle multi-beamlet systems is shown for example in U.S. Pat. No. 5,905,267, in which an electron beam is expanded, collimated and split by an aperture array into a plurality of beamlets. The obtained image is then reduced by a reduction electron optical system and projected onto a wafer. The reduction electron optical system focuses and demagnifies all the beamlets together, so that the entire set of beamlets is imaged and reduced in size. In this design, all the beamlets cross at a common cross-over, which introduces distortions and reduction of the resolution due to interactions between the charged particles in the beamlets.

Designs without such a common cross-over have also been proposed, in which the beamlets are focused and demagnified individually. However, when such a system is constructed having a large number of beamlets, providing multiple lenses for controlling each beamlet individually becomes impractical. The construction of a large number of individually controlled lenses adds complexity to the system, and the pitch between the lenses must be sufficient to permit room for the necessary components for each lens and to permit access for individual control signals to each lens. The greater height of the optical column of such a system results in several drawbacks, such as the increased volume of vacuum to be maintained and the long path for the beamlets which increases e.g. the effect of alignment errors caused by drift of the beamlets.

The controlled switching of beamlets may be achieved using a beamlet blanker. Controlled by control signals, a beamlet is deflected during a first period and continues without deflection during a second period of time. If deflected, the beamlet will terminate at a beam stop. If not deflected, the beamlet will pass the beam stop. In this manner, a "patterned" beamlet is generated, appearing after the beam stop. This patterned beamlet is subsequently projected onto a target surface by a projection lens system. For high resolution lithography systems designed to operate at a commercially acceptable throughput, the size, complexity, and cost of such systems becomes an obstacle.

One such beamlet blanker is known from Jpn. J. Appl. Phys. Vol. 32 (1993) Part 1, no. 12B, pp. 6012-6017. This beamlet blanker is embodied as an array for individual deflection of 1024 beamlets. The array comprises a silicon substrate with 1024 apertures, also referred to as through-holes, each in the form of a square of 25 μm×25 μm size. Wires connecting to blanking electrodes run between the holes. The highest wire density is seven wires between holes, each wire having a line width and spacing of 2 microns. Electrodes are provided by gold plating to a thickness of 40 microns. Manufacturing of such a beamlet blanker is based on a thermally oxidized silicon substrate. After wire patterning, the thermal oxide is etched. After the gold plating of the specified wires, the silicon substrate is etched from its bottom side. The first electrode is formed in a U-shaped design and operates as a ground electrode. The second electrode is block-shaped and acts as a switching electrode. The individual ground electrodes are mutually electrically connected. In operation, sixty-four bits of data for each blanking plate are read out in parallel from a DRAM each 160 ns and set in a shift register. These are then transferred over the individual wires to each of the switching electrodes in the array.

Existing charged particle beam technology is suitable for lithography systems for relatively course patterning of images, for example to achieve critical dimensions of 90 nm and higher. However, a growing need exists for improved performance. It is desired to achieve considerably smaller critical dimensions, for example 22 nm, while maintaining sufficient wafer throughput, e.g. between 10 and 60 wafers per hour.

The achievement of such smaller minimum feature size is directly related to a spot size of a single charged particle beamlet. For patterning a wafer with reduced spot size, more spots are needed to pattern a given surface area. For maintaining wafer throughput at reduced spot size, there is thus a desire of accelerating the patterning per spot.

BRIEF SUMMARY OF THE INVENTION

The present invention aims to provide a multiple beamlet charged particle lithography system able to achieve smaller critical dimensions, for example 22 nm, while maintaining sufficient wafer throughput, for example between 10 and 60 wafers per hour. These requirements go beyond the limits of the known blanker. The article Jpn. J. Appl. Phys. Vol. 32 (1993) pp. 6012-6017 discusses a preliminary experiment using block exposure and a stencil mask. The article speculates on advancing the resolution of the blanker device, distinguishing between wafers with repetitive patterns and wafers with random patterns. Assuming a linear relationship between feature size and throughput, it arrives at a throughput of around three 8" wafers per hour at the 20 nm node for wafers with repetitive patterns. For random patterns, the speed is indicated to be much lower, by a factor of 100 for the 100 nm node.

The present invention contemplates patterning 12" wafers with such random patterns. To arrive at 10 wafers per hour at 22 nm, an increase in throughput of about 1000 is needed in comparison with the speculation in above cited prior art. This greatly increased throughput poses an engineering challenge to adequately control the deflection of the beamlets. This is made more critical because errors during blanking of the beamlets cannot be corrected during a lithography process, so that specifications for a beamlet blanker need to be ultimately strict.

It is an object of the invention to provide a lithography system enabling high data rate transmission of control signals to individual deflectors.

It is a further object of the invention to provide a lithography system suitable for high throughput and still meeting requirements relating to the functional quality of the blanker, in that all blanker deflectors of an array will perform correctly.

It is another object to provide a lithography system that is easily scalable to larger beamlet numbers.

It is a further object of the invention to provide a deflector for use in such a lithography system, as well as methods for using the deflector and for using the lithography system.

The present invention meets at least part of these objectives by providing a plurality of memory cells, each cell being provided with a storage element and being connected to a deflector. It has been an insight of the invention that the transmission of control signals to individual deflectors can be increased, in that a control signal is transmitted into a storage element locally available. The control signal is loaded into the storage element once and may then be read out during the blanking period. It turns out that such loading of the control signal into the storage element requires less time than directly supplying the control signal to the deflector. This time becomes then available to provide control signals to deflectors for other beamlets, which enables higher throughputs in systems with a very large number of beamlets. The memory cell is an individual, rather localized portion of the deflection device that is able to operate without interaction with other cells. It suitably operates on the basis of control inputs addressed to it, particularly for operating during a time period on the basis of any control signals provided to the cell at the start of such time period.

The present invention provides a charged particle multi-beamlet system for exposing a target using a plurality of beamlets, the system comprising a beam generator for generating a plurality of charged particle beamlets, and a beamlet projector for projecting the patterned beamlets to the target surface, a beamlet blanker for patterning the beamlets, and a beamlet projector for projecting the patterned beamlets on to the surface of the target, the lithography system comprising a deflection device, wherein the deflection device comprises a plurality of memory cells, each cell being provided with a storage element and being connected to a deflector.

In a first embodiment, the storage element is arranged to provide a signal output after being loaded with a control signal. This enables the blanker to operate timewise independently from the provision of control signals. This further enables that control signals may be loaded into different deflectors in sequence, while these deflectors nevertheless start a new blanking period simultaneously. The storage element may be arranged to provide a signal output only in case of a change in the signal. Alternatively the storage element is arranged to provide a signal output with a frequency at least equal to the refresh rate of the control signals. Preferably, the storage element is arranged to provide the signal output regularly, with a higher frequency than the refresh rate of the control signals. Most suitably, the storage element is arranged to provide the output signal continuously.

In a further modification, the storage element is arranged to provide a signal output without requiring a read signal provided to the storage element. The provision of such read signal leads to additional circuitry and costs time. When reading from one element from a memory array, a read signal is usually required. In the present embodiment of a coupling of one storage element to a deflector, the read signal is superfluous.

In a suitable implementation, the storage element is a capacitor. A capacitor can be read out without supplying an active read signal and continues to provide a signal output for a certain period of time. Although the capacitor may be arranged as energy storage for deflecting the deflector during a blanking period, it is preferably arranged as storage of the control signal per se. An additional advantage of a capacitor is that it can be implemented in several positions and configurations: as a MOS capacitor, a trench capacitor, a capacitor defined in the metallisation structure (interconnect capacitor), as a modified MOS transistor, as a parasitic capacitor, or any other suitable type known to those of skill in the art. Particularly for very high data rates and corresponding short blanking periods, such a parasitic capacitor may be an adequate solution that allows a simple and compact construction.

The memory cell suitably comprises a switching element for loading a control signal into the storage element, in particular the capacitor. After the load operation, the switch is opened and the capacitor will provide a certain output signal level.

When the plurality of memory cells are arranged in an array, such switching element may be switched by application of appropriate voltages to first and second control lines. The memory cell is then located at an intersection of the control lines. The organisation of the memory cells into an array has the benefit that the number of control lines can be reduced significantly, thus simplifying the construction of the deflector and reducing the space required for the control lines. A preferred example of a switching element is a CMOS switch, i.e. a parallel combination of an NMOS and a PMOS transistor. The array may further comprise a voltage supply channel.

Preferably, the memory cell further comprises an amplifier and the storage element is coupled to an input of the amplifier. The amplifier provides a driving voltage to a switching electrode of the deflector. This turns out to be a viable and robust solution. The storage element is effectively used as a control signal of the locally available amplifier. This allows a separation of voltage supply from control signals. Moreover, the local presence of the amplifier implies a short distance between the amplifier and the deflector. Both effects result in reduction of power losses. That is advantageous, since power losses result in heat dissipated in the blanker device. Furthermore, increases in temperature of this device have an impact on dimensions (e.g. lateral thermal expansion), and therewith on alignment with other elements within the maskless lithographic system and hence on uniformity and accuracy of the resulting pattern transfer.

In a further embodiment, the amplifier comprises an inverter. An inverter is a very suitable topology for amplifying the control signal. The inverter has the beneficial effect that the output of the amplifier has a more digital shape than the signal received from the storage element. In other words, the deflector is either on or off. This is a very important step for obtaining a high accuracy of the patterning step of the lithography system.

It is preferred that the array has separate distribution channels for power supply and clock. Additionally ground is suitably distributed separately. Even though the clock signal may be included within the control signals, a separate distribution of the clock signal gives better results. The clock signal is for instance distributed to the amplifier. This enables that the amplifier may operate timewise independently from the preferably continuous provision of the control signal.

In a further embodiment, the loading of the storage element is controlled by a control unit, wherein signals from the control unit are optically transmitted to light sensitive elements in the deflection device. Such optical transmission is an adequate manner of supplying all control signals—which easily require data transmission rates of up to a Gbit/second or more—to the blanker.

Suitably, the signals are optically transmitted in multiplexed form. A demultiplexer is then present in the blanker device. Additionally, an intermediate memory is present for storing control signals during the time slot of demultiplexing. Suitably, this is located adjacent to the array of memory cells.

In a layout implementation of the present invention, a plurality of arrays is present. The provision of the memory cells over a plurality of arrays has several advantages. First, spaces between individual arrays may be used for the mentioned distribution channels and/or for the demultiplexer and intermediate memory. Preferably, there is one demultiplexer per array. Additionally, the spaces may be used to provide mechanical support to the deflection device. The deflection device comprises suitably a semiconductor substrate that is provided with apertures. The semiconductor substrate is locally thinned, and within the thinned area, individual apertures are present between the deflectors. Such a device easily would become mechanically fragile and subject to fractures, vibrations etc. without regular mechanical supports. Suitably, an array is used for deflection of a group of beamlets that have been defined from a single sub-beam. A plurality of sub-beams may be defined from a charged particle beam for a single source.

In an embodiment according to the invention, the deflectors and the other components present in the array, including the amplifier, the storage element, the switching element, control lines and distribution channels are all integrated into a single chip or integrated circuit. This evidently prevents complications and yield loss due to assembly.

The array of the present invention may be provided with some further advantageous implementations. These implementations might also be applied independently from the present principle of a plurality of memory cells.

In an embodiment, at least of one of the first and the second electrode has a concave shape conforming to a shape of the aperture. Due to the concave shape conforming to the shape of the aperture both the aperture size and the electrode sizes may be considerably reduced. Still, the resulting combination may provide an electric field with a deflection strength so as to deflect a beamlet sufficiently. A sufficient deflection is herein a deflection towards a position on a subsequent beam stop array, at which the beamlet is stopped. Any interaction with other beamlets as a result of the deflection is preferably prevented.

Suitably, the first and second electrode are designed as two identical mirror-image electrodes and are used with switching electronics to enable either one of the two electrodes to be set as the switching electrode, while the other operates as the ground electrode. The use of mirror-shaped electrodes provides an additional degree of freedom in the addressing of the array: beamlets may be deflected in a forward direction but also in a backwards direction without the need for driving voltages of opposite polarity. Alternatively, the driving may be implemented using a bipolar principle, i.e. with a positive voltage on one electrode and a negative electrode on the opposite one.

In a favourable embodiment, an array of deflectors is provided with a first and a second deflector that deflect in mutually different directions. This embodiment is easily implemented by varying the orientation of the electrodes. It is generally beneficial for giving freedom to deflect beamlets in a direction in which the deflected beamlet does not interfere with other beamlets, e.g. neither it crosses a trajectory of another undeflected beamlet, nor it influences an undeflected beamlet by for instance electric repulsion. The prevention of interaction with other beamlets is most relevant in case that beamlets pass the beamlet blanker obliquely.

In a specific implementation hereof, the electrodes of the deflectors in the array are arranged in correspondence with the incident angles of the beamlets. Suitably, the beamlets in a group are manipulated to converge towards a common point of convergence for each group. Then, at least some deflectors are suitably located at equal distances to such point of convergence, i.e. on a concentric circle around an optical axis for such group of beamlets. Most suitably, one group of beamlets corresponds with one array.

The beamlet manipulator may comprise a group deflector array, and the group deflector array preferably comprises a group-wise arrangement of individual deflector elements with a non-uniform deflecting action. Unblanked beamlets in each group are preferably deflected to a single point of convergence, and each group of beamlets is directed towards a different point of convergence. The group deflector array may be integrated with the beamlet blanker, the integrated group deflector/beamlet blanker being adapted to converge unblanked beamlets in each group to a common point and not converge blanked beamlets to the common point. The group deflector array may comprise a plate having apertures formed therein and electrodes associated with each aperture, the electrodes receiving electrical signals for deflecting beamlets passing through the apertures.

When applying different directions within an array, it turns out to be preferable that a central group is deflected forward and that a peripheral group is deflected backwards. The terms 'forward' and 'backwards' are herein used in line with a specific embodiment of a maskless lithography system. In this embodiment, beamlets pass the beamlet deflector, when undeflected, in an oblique direction, i.e. a direction not normal to the plane of the beamlet blanker. Specifically, such a direction includes an incident angle with the normal. The term 'forward' or 'further forward' is herein to be understood as a deflection, wherein the incident angle is increased. The term 'backwards' is herein to be understood as a deflection, wherein the incident angle is decreased.

In a further embodiment, an assembly of the beamlet blanker array and an aperture array is provided. Combining the beamlet blanker array into one assembly reduces the number of assembly steps at a later stage. The creation of such subassembly turns out to be an efficient manner to reach the alignment necessary. Suitably, the beamlet blanker array and the aperture array are each provided with mechanical posts that can be aligned to each other. More preferably but not necessarily the mechanical posts of the arrays are mechanically attached to each other. In an even further embodiment, these mechanical posts are defined between one or more arrays. Herewith, the mechanical stability of the subassembly is increased. An additional advantage is that therewith eigenfrequenties of vibrations are reduced. The arrays are etched silicon structures with suitably microscale dimensions. Vibrations in such tiny structures tend to have a high frequency. Such vibrations cannot be corrected properly in a vacuum column. By provision of mechanical posts, the array is effectively subdivided. The span width is therewith reduced and the mass is increased, leading to a major reduction of mechanical vibrations.

The system may also include a shaping aperture array for shaping the beamlets. The aperture array is adapted for defining sub-beams and the shaping aperture array is adapted for creating sub-beamlets, the aperture array and the shaping aperture array being integrated into a single unit. The group deflector array and the shaping aperture array may also be integrated in a single unit.

The beamlet manipulator may alternatively comprise a condenser lens array and a shaping aperture array. The condenser lens array is preferably adapted for focusing each sub-beam at point corresponding to a projection lens system. The shaping aperture array preferably comprises apertures for producing a plurality of beamlets from each focused sub-beam, the unblanked beamlets of the plurality of beamlets converging on a point corresponding to a projection lens system. The aperture array is preferably adapted for defining sub-beams and the shaping aperture array for creating sub-beamlets, the aperture array and the shaping aperture array preferably being integrated into a single unit.

The beamlet manipulator may also comprise first and second condenser lens arrays and a shaping aperture array. The first condenser lens array is preferably adapted for focusing the sub-beams at a common plane before the second condenser lens array, and the second condenser lens array adapted for focusing each sub-beam at a point corresponding to one of the projection lens systems. The shaping aperture array preferably comprises apertures for producing a plurality of beamlets from each sub-beam focused by the second condenser lens array, the unblanked beamlets of the plurality of beamlets converging on point corresponding to one of the projection lens systems.

The number of beamlets generated in the system is preferably larger than the number of projection lens systems, and the system may comprise at least 10,000 projection lens systems. The number of beamlets generated in the system is preferably at least three times the number of projection lens systems, and may be from 10 to 200 times the number of projection lens systems.

According to another aspect of the invention, a method of deflecting at least one charged particle beamlet is provided. This method comprises the steps of transmitting a control signal to a deflector and deflecting the beamlet on the basis of the control signal. The control signal herein is transmitted to a storage element within a memory cell connected to the deflector.

Preferably, the control signal is periodically transmitted to the storage element. Most suitably, the storage element continuously provides the control signal during a control period.

In an embodiment, the control signal in the storage element is used as an input of an amplifier providing a driving voltage to a switching electrode of the deflector. The amplifier preferably comprises an inverter for evaluating the control signal, the amplifier having a digital output.

Most suitably, the control signal is optically transmitted from a control unit to a light sensitive element that is electrically coupled to the memory cell.

According to yet another aspect of the invention, a method of transferring a pattern to a target surface is provided, using at least one charged particle beamlet. The method comprises the steps of generating the at least one charged particle beamlet; deflecting the beamlets according to a predefined modulation pattern so as to pattern the beamlets, and projecting the patterned beamlets to the target surface. Herein the deflection step is carried out by transmitting a control signal to a deflector and deflecting the beamlet on the basis of the control signal. The control signal herein is transmitted to a storage element that is located in a memory cell together with the deflector.

This method of the present invention is able to meet high throughput targets, while maintaining a high accuracy of the transferred pattern. This high accuracy is due to the high functional quality of the deflecting method of the present invention. As a result, it is enabled to transfer a pattern in two cycles of scanning a target surface. Suitably, the main portion of the pattern is transferred in the main cycle and a rest portion is transferred in the additional cycle. This "redundancy scanning" method strongly reduces the failure numbers. It is important in carryout this redundancy scanning method that a blanker deflector can be switched off correctly, in order to prevent patterning failures in advance. Additionally, additional instructions need to be sent to individual deflectors or groups of deflectors for carrying out the redundancy scan. The principle of redundancy scanning has been discussed in PCT patent application PCT/NL2006/000386, published as WO-A 2007/013802, which is incorporated herein by reference in its entirety.

According to still another aspect of the invention, a charged particle multi-beamlet system for exposing a target using a plurality of beamlets is provided, the system comprising at least one charged particle source for generating a charged particle beam, an aperture array for creating separate beamlets from the generated beam, a beamlet blanker for controllably blanking beamlets, and an array of projection lens systems for projecting beamlets on to the surface of the target, wherein the beamlet blanker comprises group-wise arranged sub-arrays of deflectors.

The beamlet blanker preferably comprises a plate having a plurality of apertures formed therein, and each deflector of the beamlet blanker comprising a switching electrode associated with an aperture for deflecting a beamlet passing through the aperture. The switching electrodes of a group of deflectors are preferably connected to electric control lines arranged in a single line of orientation, and the control lines of each of two parts of a group are preferably directed in opposed directions. Each deflector is preferably provided with a memory cell for controlling a switching electrode of the deflector, and each memory cell is electrically preferably connected to two control lines, each control line being connected in common to a row or column of memory cells of a group. The beamlet blanker may further comprise a voltage supply channel.

The direction in which the beamlets are deflected to blank the beamlets preferably differs for different beamlets in a group of beamlets. The blanking direction is preferably chosen such that the center of mass of the blanked beamlets, at the location of a beam stop array, is substantially the same as the position of the unblanked beamlets at the location. The direction of deflection of blanked beamlets may also be changed dynamically, so that the center of mass of the blanked beamlets, at the location of a beam stop array, is substantially the same as the position of the unblanked beamlets at the location.

According to still another aspect of the invention, a charged particle multi-beamlet system for exposing a target using a plurality of beamlets is provided, the system comprising a beam generator for generating a plurality of charged particle beamlets, and a beamlet projector for projecting the patterned beamlets to the target surface, a beamlet blanker for patterning the beamlets, and a beamlet projector for projecting the patterned beamlets on to the surface of the target, wherein the beamlet blanker comprising a substrate provided with apertures and deflectors with a first and a second electrode for deflecting beamlets passing through one of the apertures according to a predetermined modulation pattern, at least one of the electrodes having a concave shape.

There are several advantages to the use of electrodes with concave shape. Most relevant is that the concave shapes is conformal to the shape of the aperture. This aperture then most suitably has circular cross-section in the plane of the blanker. Preferably, the aperture is cylindrical in total. Such a shape of the aperture prevents introduction of astigmatistic aberrations, which might result from block-shaped apertures. It moreover reduces interactions between neighbouring deflectors. Both effects support to improve the accuracy of the deflector. They also help to enable a denser packing of deflectors.

According to still another aspect of the invention, a charged particle multi-beamlet system for exposing a target using a plurality of beamlets is provided, the system comprising a beam generator for generating a plurality of charged particle beamlets, and a beamlet projector for projecting the patterned beamlets to the target surface, a beamlet blanker for patterning the beamlets, and a beamlet projector for projecting the patterned beamlets on to the surface of the target, wherein the blanker comprises a substrate provided with apertures and a first and a second deflector, each provided with a set of a first and a second electrode for deflecting beamlets passing through one of the apertures according to a predetermined modulation pattern, the beamlets including an incident angle to the deflection device, the incident angle defined in comparison to a normal to the deflection device, wherein the first deflector deflects a beamlet further forward, thus increasing the incident angle of the beamlet, while the second deflector deflects a beamlet backward, thus reducing the incident angle of the beamlet.

The elucidated embodiments relating to the present lithography system also are applicable to any of the other aspects of the invention, including the deflector device, a method of deflection, and a method of transferring a pattern. Though the deflection device of the present invention is particularly suitable for use in a beamlet blanker for use in a maskless lithography system, it is not limited thereto. For instance, the present deflection device could also be advantageously applied for writing deflectors. The maskless lithographic system is suitably an electron beam system, though alternatives are not excluded. Though the memory cell is preferably connected to one individual deflector.

BRIEF DESCRIPTION OF THE DRAWINGS

Various aspects of the invention will be further explained with reference to embodiments shown in the drawings wherein:

FIG. 3 is a simplified schematic of a lithography system including a group deflection array;

FIG. 4 is a simplified schematic of the system of FIG. 3 further including a shaped aperture array;

FIG. 5 is an alternative embodiment including two condenser arrays and a shaped aperture array;

FIG. 6 is another embodiment including a single condenser array and a shaped aperture array;

FIG. 11A and FIG. 11B are conceptual diagrams illustrating the concept of multiple beamlets per projection lens;

FIGS. 12, 12A and 12B illustrate a second simplified embodiment of the invention;

DESCRIPTION OF ILLUSTRATIVE EMBODIMENTS

The following is a description of various embodiments of the invention, given by way of example only and with reference to the drawings.

Figure 1:
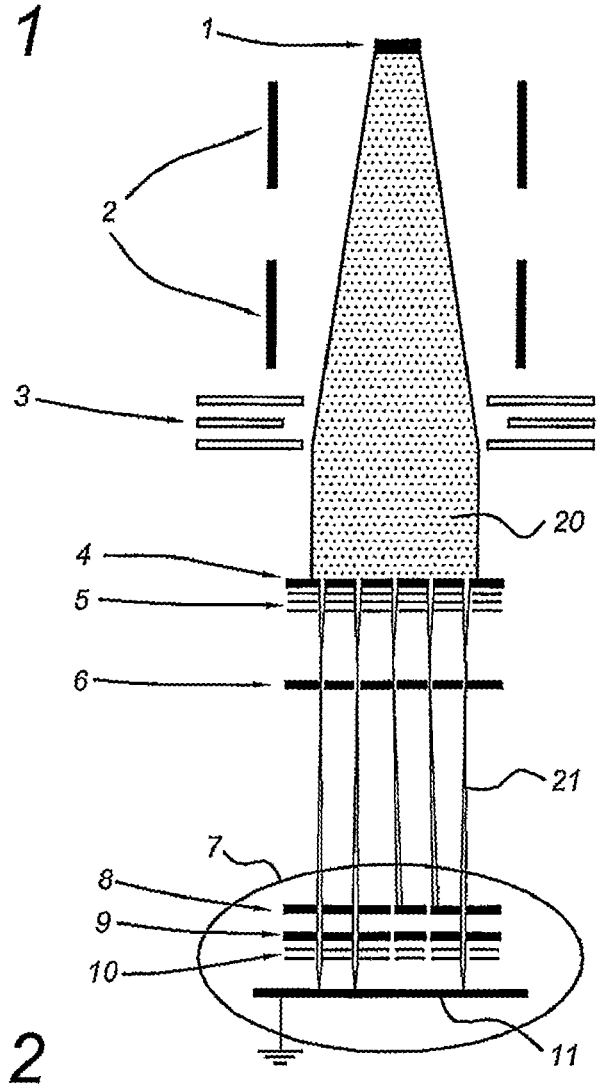
FIG. 1 is a simplified schematic overview of an example of a charged particle multi beamlet lithography system.

FIG. 1 shows a simplified schematic drawing of an embodiment of a charged particle multi-beamlet lithography system based upon an electron beam optical system without a common cross-over of all the electron beamlets. Such lithography systems are described for example in U.S. Pat. Nos. 6,897,458 and 6,958,804 and 7,084,414 and 7,129,502 which are all hereby incorporated by reference in their entirety, assigned to the owner of the present invention. In the embodiment shown in FIG. 1, the lithography system comprises an electron source 1 for producing a homogeneous, expanding electron beam 20. Beam energy is preferably maintained relatively low in the range of about 1 to 10 keV. To achieve this, the acceleration voltage is preferably low, the electron source preferably kept at between about −1 to −10 kV with respect to the target at ground potential, although other settings may also be used.

The electron beam 20 from the electron source 1 passes a double octopole 2 and subsequently a collimator lens 3 for collimating the electron beam 20. Subsequently, the electron beam 20 impinges on an aperture array 4, which blocks part of the beam and allows a plurality of beamlets 21 to pass through the aperture array 4. The aperture array preferably comprises a plate having through holes. Thus, a plurality of parallel electron beamlets 21 is produced. The system generates a large number of beamlets 21, preferably about 10,000 to 1,000,000 beamlets, although it is of course possible to use more or less beamlets. Note that other known methods may also be used to generate collimated beamlets.

The plurality of electron beamlets 21 pass through a condenser lens array 5 which focuses each of the electron beamlets 21 in the plane of a beamlet blanker array 6. This beamlet blanker array 6 preferably comprises a plurality of blankers which are each capable of deflecting one or more of the electron beamlets 21. The condenser lens array 5 and beamlet blanker array 6 are described in more detail below.

Subsequently, the electron beamlets 21 enter the end module 7. The end module 7 is preferably constructed as an insertable, replaceable unit which comprises various components. In this embodiment, the end module comprises a beam stop array 8, a beam deflector array 9, and a projection lens arrangement 10, although not all of these need be included in the end module and they may be arranged differently. The end module 7 will, amongst other functions, provide a demagnification of about 25 to 500 times, preferably in the range 50 to 200 times. A slightly lesser demagnification is required in systems generating patterned beamlets. The end module 7 preferably deflects the beamlets as described below. After leaving the end module 7, the beamlets 21 impinge on a surface of a target 11 positioned at a target plane. For lithography applications, the target usually comprises a wafer provided with a charged-particle sensitive layer or resist layer.

In the end module 7, the electron beamlets 21 first pass beam stop array 8. This beam stop array 8 largely determines the opening angle of the beamlets. In this embodiment, the beam stop array comprises an array of apertures for allowing beamlets to pass through. The beam stop array, in its basic form, comprises a substrate provided with through holes, typically round holes although other shapes may also be used. In one embodiment, the substrate of the beam stop array 8 is formed from a silicon wafer with a regularly spaced array of through holes, and may be coated with a surface layer of a metal to prevent surface charging. In one embodiment, the metal is of a type which does not form a native-oxide skin layer, such as CrMo.

In one embodiment, the passages of the beam stop array 8 are aligned with the elements of the beamlet blanker array 6. The beamlet blanker array 6 and beam stop array 8 operate together to block or let pass the beamlets 21. If beamlet blanker array 6 deflects a beamlet, it will not pass through the corresponding aperture in beam stop array 8, but instead will be blocked by the substrate of beam stop array 8. But if beamlet blanker array 6 does not deflect a beamlet, then it will pass through the corresponding aperture in beam stop array 8 and will then be projected as a spot on the surface of target 11. In this way the individual beamlets may be effectively switched on and off.

Next, the beamlets pass through a beam deflector array 9 which provides for deflection of each beamlet 21 in the X and/or Y direction, substantially perpendicular to the direction of the undeflected beamlets 21. Next, the beamlets 21 pass through projection lens arrangement 10 and are projected onto a target 11, typically a wafer, in a target plane.

For consistency and homogeneity of current and charge both within a projected spot and among the projected spots on the target, and as beam stop plate 8 largely determines the opening angle of a beamlet, the diameter of the apertures in beam stop array 8 are preferably smaller than the diameter of the beamlets when they reach the beam stop array. In one embodiment, the apertures in beam stop array 8 have a diameter are in a range of 5 to 20 μm, while the diameter of the beamlets 21 impinging on beam stop array 8 in the described embodiment are typically in the range of about 15 to 75 μm.

The diameter of the apertures in beam stop plate 8 in the present example limit the cross section of a beamlet, which would otherwise be of a diameter value within the range of 30 to 75 μm, to the above stated value within the range of 5 to 20 μm, and more preferably within the range of 5 to 10 μm. In this way, only a central part of a beamlet is allowed to pass through beam stop plate 8 for projection onto target 11. This central part of a beamlet has a relatively uniform charge density. Such cut-off of a circumferential section of a beamlet by the beam stop array 8 also largely determines the opening angle of a beamlet in the end module 7 of the system, as well as the amount of current at the target 11. In one embodiment, the apertures in beam stop array 8 are round, resulting in beamlets with a generally uniform opening angle.

Figure 2:
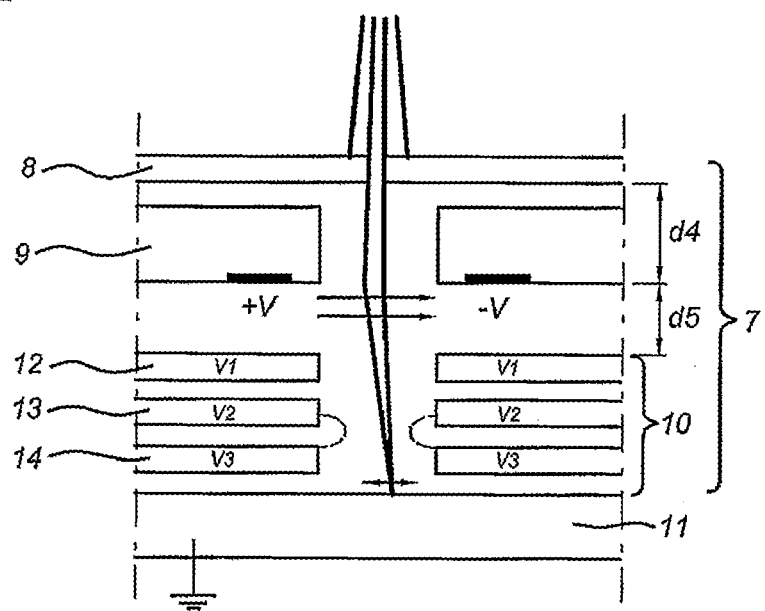
FIG. 2 is a simplified schematic overview, in side view, of an end module of the lithography system of FIG. 1.

FIG. 2 shows an embodiment of end module 7 in more detail, showing the beam stop array 8, the deflection array 9, and the projection lens arrangement 10, projecting an electron beamlet onto a target 11. The beamlets 21 are projected onto target 11, preferably resulting in a geometric spot size of about 10 to 30 nanometers in diameter, and more preferably about 20 nanometers. The projection lens arrangement 10 in such a design preferably provides a demagnification of about 100 to 500 times. In this embodiment, as shown in FIG. 2, a central part of a beamlet 21 first passes through beam stop array 8 (assuming it has not been deflected by beamlet blanker array 6). Then, the beamlet passes through a deflector or set of deflectors arranged in a sequence forming a deflection system, of beam deflector array 9. The beamlet 21 subsequently passes through an electro-optical system of projection lens arrangement 10 and finally impinges on a target 11 in the target plane.

The projection lens arrangement 10, in the embodiment shown in FIG. 2, has three plates 12, 13 and 14 arranged in sequence, used to form an array of electrostatic lenses. The plates 12, 13, and 14 preferably comprise plates or substrates with apertures formed in them. The apertures are preferably formed as round holes though the substrate, although other shapes can also be used. In one embodiment, the substrates are formed of silicon or other semiconductor processed using process steps well-known in the semiconductor chip industry. The apertures can be conveniently formed in the substrates using lithography and etching techniques known in the semiconductor manufacturing industry, for example. The lithography and etching techniques used are preferably controlled sufficiently precisely to ensure uniformity in the position, size, and shape of the apertures. This uniformity permits the elimination of the requirement to individually control the focus and path of each beamlet.

Uniformity in the positioning of the apertures, i.e. a uniform distance (pitch) between the apertures and uniform arrangement of the apertures over the surface of the substrate, permits the construction of a system with densely packed beamlets which generate a uniform grid pattern on the target. In one embodiment, where the pitch between the apertures is in the range 50 to 500 microns, the deviation in the pitch is preferably 100 nanometers or less. Furthermore, in systems where multiple plates are used, the corresponding apertures in each plate are aligned. Misalignment in the apertures between plates may cause a difference in focal length along different axes.

Uniformity in the size of the apertures enables uniformity in the electrostatic projection lenses formed at the locations of the apertures. Deviation in the size of the lenses will result in deviation in the focusing, so that some beamlets will be focused on the target plane and others will not. In one embodiment, where the size of the apertures in the range of 50 to 150 microns, the deviation in the size is preferably 100 nanometers or less.

Uniformity in the shape of the apertures is also important. Where round holes are used, uniformity in the roundness of the holes results in the focal length of the resulting lens being the same in both axes.

The substrates are preferably coated in an electrically conductive coating to form electrodes. The conductive coating preferably forms a single electrode on each substrate covering both surfaces of the plate around the apertures and inside the holes. A metal with a conductive native oxide is preferably used for the electrode, such as molybdenum, deposited onto the plate using techniques well known in the semiconductor manufacturing industry, for example. An electrical voltage is applied to each electrode to control the shape of the electrostatic lenses formed at the location of each aperture. Each electrode is controlled by a single control voltage for the complete array. Thus, in the embodiment shown with three electrodes lens there will be only three voltages for all the thousands of lenses.

FIG. 2 shows the plates 12, 13, and 14 having electric voltages V1, V2 and V3 respectively applied to their electrodes. The voltage differences between the electrodes of plates 12 and 13, and between plates 13 and 14, create electrostatic lenses at the location of each aperture in the plates. This generates a "vertical" set of electrostatic lenses at each position in the array of apertures, mutually aligned, creating an array of projection lens systems. Each projection lens system comprises the set of electrostatic lenses formed at corresponding points of the arrays of apertures of each plate. Each set of electrostatic lenses forming a projection lens system can be considered as a single effective projection lens, which focuses and demagnifies one or more beamlets, and has an effective focal length and an effective demagnification. In systems where only a single plate is used, a single voltage may be used in conjunction with a ground plane, such that electrostatic lenses are formed at the location of each aperture in the plate.

Variation in the uniformity of the apertures will result in variation in the electrostatic lenses forming at the locations of the apertures. The uniformity of the apertures results in uniform electrostatic lenses. Thus, the three control voltages V1, V2, and V3 create an array of uniform electrostatic lenses which focus and demagnify the large number of electron beamlets 21. The characteristics of the electrostatic lenses are controlled by the three control voltages, so that the amount of focusing and demagnification of all of the beamlets can be controlled by controlling these three voltages. In this way, a single common control signal can be used to control a whole array of electrostatic lenses for demagnifying and focusing a very large number of electron beamlets. A common control signal may be provided for each plate or as a voltage difference between two or more plates. The number of plates used in different projection lens arrangements may vary, and the number of common control signals may also vary. Where the apertures have sufficiently uniform placement and dimensions, this enables the focusing of the electron beamlets, and demagnification of the beamlets, using one or more common control signals. In the embodiment of FIG. 2, three common signals comprising the three control voltages V1, V2, and V3 are thus used to focus and demagnify all of the beamlets 21.

The projection lens arrangement preferably forms all of the focusing means for focusing the beamlets onto the target surface. This is made possible by the uniformity of the projection lenses, which provide sufficiently uniform focusing and demagnification of the beamlets so that no correction of the focus and/or path of individual electron beamlets is required. This considerably reduces the cost and complexity of the overall system, by simplifying construction of the system, simplifying control and adjustment of the system, and greatly reducing the size of the system.

In one embodiment, the placement and dimensions of the apertures where the projection lenses are formed are controlled within a tolerance sufficient to enable focusing of the electron beamlets using one or more common control signals to achieve a focal length uniformity better than 0.05%. The projection lens systems are spaced apart at a nominal pitch, and each electron beamlet is focused to form a spot on the surface of the target. The placement and dimensions of the apertures in the plates are preferably controlled within a tolerance sufficient to achieve a variation in spatial distribution of the spots on the surface of the target of less than 0.2% of the nominal pitch.

The projection lens arrangement 10 is compact with the plates 12, 13, 14 being located close to each other, so that despite the relatively low voltages used on the electrodes (in comparison to voltages typically used in electron beam optics), it can produce very high electrical fields. These high electrical fields generate electrostatic projection lenses which have a small focal distance, since for electrostatic lenses the focal length can be estimated as proportional to beam energy divided by electrostatic field strength between the electrodes. In this respect, where previously 10 kV/mm could be realized, the present embodiment preferably applies potential differences within the range of 25 to 50 kV/mm between the second plate 13 and third plate 14. These voltages V1, V2, and V3 are preferably set so that the difference in voltage between the second and third plates (13 and 14) is greater than the difference in voltage between first and second plates (12 and 13). This results in stronger lenses being formed between plates 13 and 14 so that the effective lens plane of each projection lens system is located between plates 13 and 14, as indicated in FIG. 2 by the curved dashed lines between plates 13 and 14 in the lens opening. This places the effective lens plane closer to the target and enables the projection lens systems to have a shorter focal length. It is further noted that while, for simplicity, the beamlet in FIG. 2 is shown focused as from the deflector 9, a more accurate representation of the focusing of beamlet 21, e.g. as in a traced ray illustration, would indicate that the actual lens plane of lens system 10 is between plates 13 and 14. It should also be noted that the distance d3 between lowermost plate 14 and target plane 11 should be very small in this design to allow for the short focal length.

The electrode voltages V1, V2, and V3 are preferably set so that voltage V2 is closer to the voltage of the electron source 1 than is voltage V1, causing a deceleration of the charged particles in beamlet 21. In one embodiment, the target is at 0V (ground potential) and the electron source is at about −5 kV relative to the target, voltage V1 is about −4 kV, and voltage V2 is about −4.3 kV. Voltage V3 is at about 0V relative to the target, which avoids a strong electric field between plate 14 and the target which can cause disturbances in the beamlets if the topology of the target is not flat. The distances between the plates (and other components of the projection system) are preferably small. With this arrangement, a focusing and demagnifying projection lens is realized, as well as a reduction in the speed of extracted charged particles in the beamlets. With the electron source at a voltage of about −5 kV, charged particles are decelerated by the central electrode (plate 13), and subsequently accelerated by the bottom electrode (plate 14) having a voltage at ground potential. This deceleration permits the use of lower electrical fields on the electrodes while still achieving the desired demagnification and focusing for the projection lens arrangement. An advantage of having three electrodes with control voltages V1, V2 and V3, rather than only two electrodes with control voltages V1 and V2 as used in previous systems is that control of the focusing of the beamlets is decoupled to some extent from control of the beamlet acceleration voltage. This decoupling occurs because the projection lens systems can be adjusted by adjusting the voltage differential between voltages V2 and V3 without changing voltage V1. Thus the voltage differential between voltage V1 and the source voltage is largely unchanged so that the acceleration voltage remains essentially constant, reducing the alignment consequences in the upper part of the column.

FIG. 2 also illustrates deflection of a beamlet 21 by deflection array 9 in the Y-direction, illustrated in FIG. 2 as a deflection of the beamlet from left to right. In the embodiment of FIG. 2, an aperture in deflection array 9 is shown for one or more beamlets to pass through, and electrodes are provided on opposite sides of the aperture, the electrodes provided with a voltage +V and −V. Providing a potential difference over the electrodes causes a deflection of the beamlet or beamlets passing though the aperture. Dynamically changing the voltages (or the sign of the voltages) will allow the beamlet(s) to be swept in a scanning fashion, here in the Y-direction.

In the same way as described for deflection in the Y-direction, deflection in the X-direction may also be performed back and/or forth (in FIG. 2 the X-direction is in a direction into and out of the paper). In the embodiment described, one deflection direction may be used for scanning the beamlets over the surface of a substrate while the substrate is translated in another direction using a scanning module or scanning stage. The direction of translation is preferably transverse to the Y-direction and coinciding with the X-direction.

The arrangement of the deflectors and lenses of the end module 7 with respect to one another as described differs from what has generally been expected in the art of particle optics. Typically, a deflector is located after a projection lens, so that the focusing is accomplished first and then the focused beamlet is deflected. First deflecting a beamlet and then focusing it, as in the system in FIGS. 2 and 3, results in the beamlet entering the projection lens off axis and at an angle with respect to the optical axis of the projection lens. It is evident to the person skilled in the art that the latter arrangement may give rise to considerable off-axis aberrations in the deflected beamlet.

In the application of the projection system for lithography, a beamlet should be focused and positioned at ultra high precision, with spot sizes of tens of nanometers, with an accuracy in size of nanometers, and a position accuracy in the order of nanometers. The inventors realized that deflecting a focused beamlet, for example several hundreds of nanometers away from the optical axis of a beamlet, would easily result in an out-of-focus beamlet. In order to meet the accuracy requirements, this would severely limit the amount of deflection or the beamlet would rapidly become out of focus at the surface of target 11.

As discussed above, in order to achieve the objectives of the projection lens arrangement in view of its use in a lithography system, the effective focal length of the projection lens systems is short, and the lens plane of the projection lens systems is positioned very close to the target plane. Thus, there is very little space left between the projection lens and the target plane for a beamlet deflection system. The inventors recognized that the focal length should be of such limited magnitude that any deflector or deflector system should be located before the projection lens despite the evident occurrence of off-axis aberrations with such an arrangement.

The arrangement shown in FIGS. 1 and 2 of the deflection array 9 upstream and projection lens arrangement 10 downstream furthermore allows a strong focusing of beamlet 21, in particular to permit a reduction in size (demagnification) of the beamlets of at least about 100 times, and preferably about 350 times, in systems where each projection lens system focuses only one beamlet (or a small number of beamlets). In systems where each projection lens system focuses a group of beamlets, preferably from 10 to 100 beamlets, each projection lens system provides demagnification of at least about 25 times, and preferably about 50 times. This high demagnification has another advantage in that requirements as to the precision of the apertures and lenses before (upstream of) the projection lens arrangement 10 are much reduced, thereby enabling construction of the lithography apparatus, at a reduced cost. Another advantage of this arrangement is that the column length (height) of the overall system can be greatly reduced. In this respect, it is also preferred to have the focal length of the projection lens small and the demagnification factor large, so as to arrive to a projection column of limited height, preferably less than one meter from target to electron source, and more preferably between about 150 and 700 mm in height. This design with a short column makes the lithography system easier to mount and house, and it also reduces the effect of drift of the separate beamlets due to the limited column height and shorter beamlet path. The smaller drift reduces beamlet alignment problems and enables a simpler and less costly design to be used. This arrangement, however, puts additional demands on the various components of the end module.

With a deflection system located upstream of a projection system, the deflected beamlets will no longer pass through the projection system at its optical axis. Thus, an undeflected beamlet which was focused on the target plane will now be out-of-focus at the target plane when deflected. In order to limit the out-of-focus effect due to deflection of the beamlets, in the end module of one embodiment the deflection array 9 is positioned as close as possible to the projection lens array 10. In this way, deflected beamlets will still be relatively close to their undeflected optical axis when they pass through the projection lens array. Preferably the deflection array is positioned at about 0 to 5 mm from the projection lens array 10, or preferably as close as possible while maintaining isolation from the projection lens. In a practical design, to accommodate wiring, a distance of 0.5 mm may be used.

With an arrangement as described above, the main lens plane of the projection lens system 10 is preferably located between the two plates 13 and 14. The overall energy of the charged particles in the system according to the embodiments described above is kept relatively low, as mentioned previously. For an electron beam, for example, the energy is preferably in the range of up to about 10 keV. In this way, generation of heat at the target is reduced. However, with such low energy of the charged particles, chromatic aberration in the system increases. This requires specific measures to counteract this detrimental effect. One of these is the already mentioned relatively high electrostatic field in the projection lens arrangement 10. A high electrostatic field results in forming electrostatic lenses having a low focal length, so that the lenses have low chromatic aberration.

Chromatic aberration is generally proportional to the focal length. In order to reduce chromatic aberration and provide a proper projection of electron beams onto the target plane, the focal length of the optical system is preferably limited to one millimeter or less. Furthermore, the final plate 14 of the lens system 10 according to the present invention is made very thin to enable a small focal length without the focal plane being inside the lens. The thickness of plate 14 is preferably within the range of about 50 to 200 μm.

It is desired to keep the acceleration voltage relatively low for reasons mentioned above, to obtain a relatively strong demagnification, and to maintain the aberration as low as possible. In order to meet these contradictory requirements, an arrangement is conceived having the lenses of the projection lens system positioned closely together. This new concept requires the lower electrode 14 of the projection lens preferably being provided as close as possible to the target plane, with the effect that the deflector is preferably located before the projection lens. Another measure to mitigate the aberrations caused by the arrangement of the end module 7 is to locate the deflector 9 and the projection lens arrangement 10 at minimal mutual distance.

The mutual distances in a lens array, as indicated above, are of a highly miniaturized nature. In this respect the mutual distances between plates 12, 13 and 14 are in the same order of magnitude as the thickness of the plate 13. In a preferred embodiment these mutual distances are in a range of about 100 to 200 μm. The distance from the final plate 14 to the target plane is preferably smaller than distance between the plates to allow for a short focal length. However, a minimal distance is required between the lower surface of plate 14 and surface of the wafer to provide allowance for mechanical movement of wafer. In the presently exemplified embodiment the distance from the final plate 14 to the target plane is about 50 to 100 μm. In one embodiment, the distance between plates 13 and 14 is about 200 μm, and the distance between plate 14 and the target plane is about 50 μm. These distances are related to the voltages V1, V2, and V3, and the size of the apertures 18 of the lenses of plates 12, 13 and 14 for allowing deflected beamlets to pass while focusing one or more beamlets.

In the design of an end module 7 as illustrated, the diameter of the apertures of the lenses of the plates 12, 13 and 14, is a number of times larger than the diameter of the coaxially aligned apertures of beam stop array 8, which preferably have a diameter of about 5 to 20 μm. The diameter of the apertures is preferably in range of about 50 to 150 μm. In one embodiment, the diameter is about 100 μm and the diameter of the apertures of the beam stop array is about 15 μm.

Furthermore, in the present design, the central substrate of plate 13 has the largest thickness, preferably in the range of about 50 to 500 μm. The thickness of the substrate for plate 12 is relatively smaller, preferably about 50 to 300 μm, and for plate 14 relatively smallest, preferably about 50 to 200 μm. In one embodiment, the thickness of the substrate for plate 13 is about 200 μm, for 12 is about 150 μm, and for 14 is about 150 μm.

The total current of the beamlets required to achieve a particular throughput (i.e. a particular number of wafers exposed per hour) depends on the required dose, the area of the wafer, and the overhead time (e.g. the time to move a new wafer into position for exposure). The required dose in these shot noise limited systems depends on the required feature size and uniformity, and beam energy, among other factors.

To obtain a certain feature size (critical dimension or CD) in resist using electron beam lithography, a certain resolution is required. This resolution is determined by three contributions: beam size, the scattering of electrons in the resist, and secondary electrons mean free path combined with acid diffusion. These three contributions add up in a quadratic relation to determine the total spot size. Of these three contributions the beam size and the scattering depend on the acceleration voltage. To resolve a feature in the resist the total spot size should be of the same order of magnitude as the desired feature size (CD). Not only the CD but also the CD uniformity is important for practical applications, and this latter requirement will determine the actual required spot size.

For electron beam systems, the maximum single beam current is determined by the spot size. For small spot size the current is also very small. To obtain a good CD uniformity, the required spot size will limit the single beam current to much less than the current required to obtain a high throughput. Thus a large number of beamlets is required (typically more than 10,000 for a throughput of 10 wafers per hour). For an electron beam system, the total current through one lens is limited by Coulomb interactions between electrons, so that a limited number of beamlets can be sent through one lens and/or one cross-over point. This consequently means that the number of lenses in a high throughput system also needs to be large.

In a preferred embodiment, a very dense arrangement of a large number of low energy beamlets is achieved, such that the multiple beamlets can be packed into an area comparable in size to the size of a typical wafer exposure field.

The pitch of the apertures in the plates 12, 13 and 14 of the projection lens is preferably as small as possible to create as many electrostatic lenses as possible in a small area. This enables a high density of beamlets. The large number of beamlets spaced closely together in a high density arrangement also reduces the distance the beamlets must be scanned across the target surface. However, reduction in the pitch for a given bore size of the apertures is limited by manufacturing and structural problems caused when the plate becomes too fragile due to the small distances between the apertures, and by possible aberrations in a lens caused by fringe fields of neighboring lenses.

The multi-beamlet charged particle system is designed to considerably reduce the spot size while at the same time considerably increasing the current generated in the system. In doing so, it was also realized that by increasing the current in the system, the total current on the target is also increased to limit development of shot noise. At the same time, however, the number of electrons impinging on the target surface per square critical dimension (i.e. per unit of area of CD squared) should be maintained constant. These requirements necessitate modification to the design of the charged particle system, as discussed in detail below, and for optimum performance a target with relatively high sensitivity resist is required, by way of example typically from 30 $\mu m/cm^2$ as currently practiced to double that value. It is remarked at this point that spot size in practice corresponds to, and is, as an easier to conceive term, in the remainder of the text used in stead of "point spread function". Another practical aspect of the concept according to the invention is that the spot size amounts in order of magnitude to the CD size.

Not only is a reduced spot size required to achieve the desired performance, but also a reduced point spread function of beamlets is required to maintain sufficient exposure latitude. Sufficient exposure latitude requires a relatively high ratio of peak exposure level on the target from a beamlet compared to base or background level of exposure as normally caused by the peripheral Gaussian parts of neighbouring beamlets. Designing a system to generate beamlets having a smaller point spread function, however, considerably reduces the charged particle current that may be applied to the target by each beamlet. Irrespective of the brightness of the charged particle source used, the preceding requirements of reduced spot size, increased current, and reduced point spread function implies a considerably more than linear increase in the number of beamlets in the system compared to the reduction in critical dimension at the same wafer throughput.

The requirement for a considerable increase in the number of beamlets in the system creates a practical problem due to the of the limited physical dimensions of the projection optics of a multi-beamlet lithography system. The projection optics in such systems are typically limited in size to accommodate, for example the fields of the target to be exposed by the system. There is a limit to the number of lenses that may be physically realized within a relatively small area that the projection optics, i.e. the end projection module may occupy in practical designs. At the reduced critical dimensions to be achieved, the number of lenses that can be constructed within these dimensions using known techniques is considerably smaller than the number of beamlets required to achieve the desired wafer throughput.

One solution is to reduce the image of the aperture array 4 using a condenser lens or series of condenser lenses, thereby also reducing the pitch of the beamlets. However, this solution typically results in a common cross-over of all the beamlets, which causes a significant amount aberration. This is not desirable, particularly in view of the present requirements, and would further complicate the system to counteract this aberration. The present invention avoids a common cross-over of the beamlets and thus avoids this drawback by dividing the required reduction of the image of the aperture array 4 over a multitude of cross-overs, thus limiting the energy in each cross-over. This has the effect of more than proportionally limiting the amount of aberration in the system. This is achieved by adding array manipulators to the system, for example a group deflector array or a condenser lens array for directing a plurality of beamlets towards a single projection lens system for projecting onto the target.

The principal solution introduced in the preceding paragraph, will be illustrated along various examples in the following. It allows the use of technology corresponding to that applied in the concept of FIG. 1 and minimizes aberration in the system while allowing a disproportionate increase in the number of beamlets in the system. This principal solution using multiple beamlets per projection lens was found after recognition of the fact that with the deflecting action of deflector array 9 in the end module 7, a virtual point of origin of the deflected beamlet is created, so that a virtual beamlet was imagined. This notion led to the idea that such virtual beamlet could as well be replaced by a real beamlet, or a plurality of real beamlets. In practice the application of multiple real beamlets through a single projection lens system appeared to be possible without disturbing the amount of aberration, especially where the total beamlets of the system were distributed over a multiplicity of projection lens systems.

Because part or all of the plurality of beamlets directed through to a each projection lens system may be blanked at any point in time during operation, the system according to the present invention is also referred to as a patterned beamlet system. This patterned beamlet system may also be regarded as a multiplicity of miniaturized imaging systems arranged side by side.

FIG. 3 illustrates one embodiment of a design according to the invention, for enabling an increased number of beamlets in the system, permitting increased current at the wafer or reduced spot size or both. In this embodiment, a group deflector array 6G is provided above beamlet blanker array 6 in the system of FIG. 1, between the condenser lens array 5 and beamlet blanker array 6, although the group deflector array 6G may also be located below array 6. The group deflector array 6G comprises an array of deflection elements which deflect the beamlets in groups towards the end module (projection module) 7, through openings in the beam stop array 8 and through the corresponding projection lens systems formed under each opening.

The group deflector array 6G preferably comprises one or more plates with an array of apertures formed in them at locations corresponding to the apertures in aperture array 4, condenser lens array 5, and beamlet blanker array 6. Electrodes are formed at the location of each aperture, as shown in more detail in FIGS. 18 and 19. Each element of the group deflector 6G operates to deflect one or more beamlets 21 towards a particular projection lens in the array projection lens systems of the end module 7. FIG. 3 shows three groups of three beamlets deflected by deflector array 6G, so that three beamlets are directed through each projection lens system in the end module 7. In this embodiment there are thus three times as many apertures in aperture array 4, condenser lens array 5, group deflector array 6G, and beamlet blanker array 6, than there are projection lens systems formed in the end module 7.

Although three beamlets per projection lens system is shown in FIG. 3, other numbers of beamlets per projection lens system may also be used, and groups of up to 100 beamlets or more can be directed through each projection lens system. In a preferred embodiment, groups of 49 beamlets in an array of 7 by 7 are deflected through each projection lens system.

Although FIG. 3 shows the arrays 4, 5, 6G, and 6 being approximately the same size as the end module 7, they may be may larger, particularly for designs having a large number of beamlets per projection lens system which necessitates a much larger number of apertures in the arrays 4, 5, 6G, and 6 compared with the end module 7.

Preferably the apertures in the beam stop array 8, which define the beamlet opening angle, are relatively small as if they were limiting only a single beamlet. Larger apertures would require a larger deflection path, would be more susceptible to "tail" effects caused by only partial blanking of a blanked beamlet, and would further reduce the limited space available on beam stop array 8 for blanking beamlets.

In principle each group of beamlets can be concentrated (i.e. directed to a single point where they intersect and cross-over) either at the relevant aperture of beam stop array 8, or at the effective lens plane of the relevant projection lens system. In practice the concentration will be somewhere between these two points (although not clearly shown in drawings), since concentrating the beamlets at the beam stop array would create a lens error while concentrating the beamlets at the effective lens plane of the projection lens would cause a dose error.

In this design, with multiple beamlets passing through each projection lens system, the charged particle optics slit does not consist of a regular array of beamlets but of a regular array of groups of beamlets. Note that the beamlets may also be deflected by beamlet blanker array 6 after passing though group deflector array 6G. At any instant some of the beams in a group may be directed through a corresponding opening in beam stop array 8 and projected onto the target, while other beamlets are deflected an additional amount by beamlet blanker array 6. This additional deflection causes these beamlets to miss the opening in beam stop array 8 so they are blocked from reaching the target, and are thereby blanked or "switched off" as described previously. Thus, each group of beamlets exposes a pattern determined by the beam blanker array 6, and each group can be considered as a single patterned beamlet.

FIGS. 11A and 11B are schematic diagrams of the path of beamlets in the end module 7, to illustrate a concept and insight underlying the grouping of beamlets. FIG. 11A shows a system having a single beamlet per projection lens system. A single beamlet 21 passes through an aperture in the beam stop array 8, is deflected by deflector array 9, and focused by a projection lens arrangement 10. The deflected beamlet can be considered as a separate 'virtual' beamlet arriving at an inclined angle from a different origin than the actual beamlet 21. For example, when beamlet 21 is deflected to the left, it can be regarded as a virtual beamlet 21V originating from a location to the right of the actual origin of beamlet 21, and similarly when beamlet 21 is deflected to the right, it can be regarded as a virtual beamlet 21V originating from a location to the left of the actual origin of beamlet 21. FIG. 11B shows a system having three beamlets per projection lens system, each beamlet originating from a separate point and passing though a projection lens system at different angles. The net effect is the same as a single deflected beamlet, except that the current is three times greater in the system of FIG. 11B. Aperture plate 8 above the deflector array 9 may comprise a multiplicity of apertures 23 as depicted, or with a single relatively large aperture, or a patterned opening having a particular shape, to accommodate the multiple beamlets.

Figure 13A:
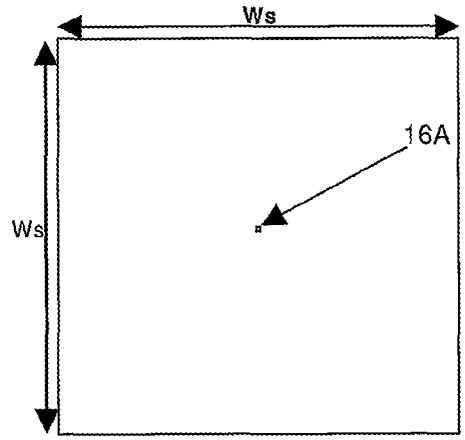
FIGS. 13A and 13B illustrate an advantage of the multiple beamlet per projection lens arrangement.

FIG. 13 is a schematic diagram to illustrate an advantage of the described arrangement with multiple beamlets per projection lens system. FIG. 13A shows a square deflection field of magnitude Wd, which in practice typically may be around 2 μm, and with a typical Gaussian beamlet spot 16A with geometric spot size diameter of 10 nm. Using this beamlet spot to expose the deflection field, approximately only 20 parts per million of the deflection field is exposed at any instant.

Figure 13B:
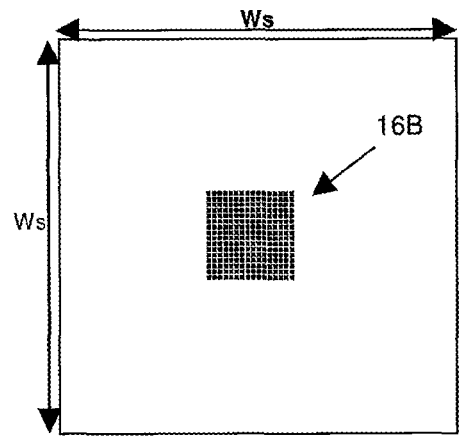

FIG. 13B shows the deflection field with the presently proposed design, the deflection field exposed by a patterned beamlet 16B. Up to about 20% of the deflection field may theoretically be exposed simultaneously by the patterned beamlet. In practice up to 200 times improvement may be attained as depicted schematically by FIG. 13B. In this example an array of 16 by 16 relatively small spots is shown (the representation of the array appears disproportionately large in the drawing for clarity). The multiplication of the number of beamlets that may be written simultaneously by one projection lens, together with improved beamlet intensity, results in maintained of even increased throughput of the system at considerably advanced technology nodes, e.g. expressed by measure of critical dimension in projection.

Figure 18A:
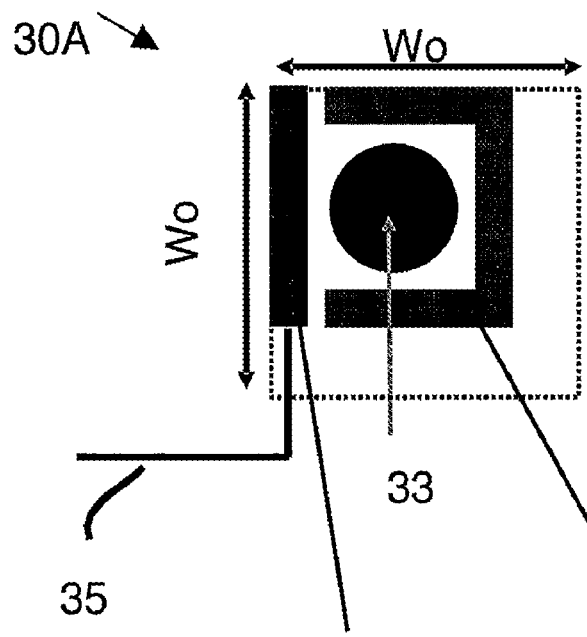
FIGS. 18A and 18B are schematic diagrams of an embodiment of deflectors for a group deflector array or beam blanker array.
Figure 18B:
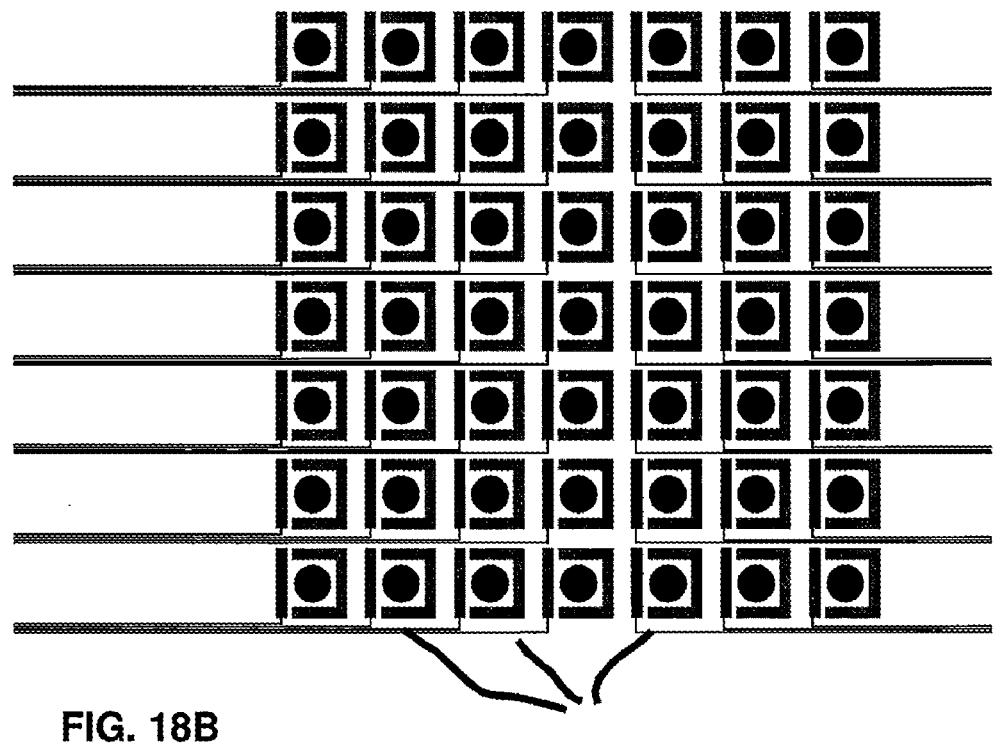

FIGS. 18A and 18B are schematic diagrams of one embodiment of deflectors for the group deflector array 6G and/or beam blanker array 6 of FIG. 3. An array of apertures are formed, preferably as round holes, though a plate. In one embodiment, the plate is formed of silicon or other semiconductor material, processed using process steps well-known in the semiconductor industry. The apertures can be formed using lithography and etching techniques known in the semiconductor industry. Similarly to the plates of the projection lens arrangement 10, the lithography and etching techniques used are preferably controlled sufficiently precisely to ensure uniformity in the position, size, and shape of the apertures. FIG. 18A shows a single deflector 30A comprising one element of a beam blanker array 6 or group deflector array 6G.

The deflector 3A is formed within a budgeted square area of dimension Wo by Wo. The deflector element comprises a switching electrode 32 and a ground electrode 34, arranged around a through hole 33, through which a beamlet to be deflected may pass. The electrodes are shown as simple rectangular shapes in this embodiment, with switching electrode 32 being a straight element and ground electrode 34 formed in a U-shape. However, rounded or at least concave shapes conforming to the shape of the through hole 33 are preferred. Such a round-edged design allows a more compact design, and facilitates the arrangement of deflector elements in an array, and also facilitates the inclusion of switching electronics which may be used in some embodiments.

The switching electrode 32 receives an electrical signal which generates a electromagnetic field sufficient to deflect a beamlet passing through the aperture 33 so that the beamlet passes through a corresponding aperture in beam stop array 8, and then through the corresponding projection lens system (unless the beam blanker array 6 also deflects the beamlet so that it misses the aperture in beam stop array 8 and is blanked).

In another embodiment, the two electrodes may be designed as two identical mirror-image electrodes, and used with switching electronics to enable either one of the two electrodes to be set as the switching electrode while the other operates as the ground electrode. This is of particular advantage in embodiments with a combined group deflector and beam blanker array, where in some cases it may be beneficial to deflect "backwards" rather than "further forwards." The two types of deflectors may be mixed, for example with a central group in the group deflector/beam blanker array deflecting "further forwards" for beamlet blanking, and a peripheral group deflecting "rearwards" for blanking.

FIG. 18B shows a schematic diagram of a portion of an array of the deflector elements 30A. Individual electrical connections are formed to each switching electrode 32 of each deflector element. These wiring connections can be made, for example, by forming electrical control lines 35 as conductive structures on the surface of the plate of the group deflector array using conventional lithography and etching techniques. In the example shown, a group of 7 by 7 deflectors will require 49 electrical control lines 35. The control lines preferably run towards opposed sides of a deflector group as shown.

Figure 19A:
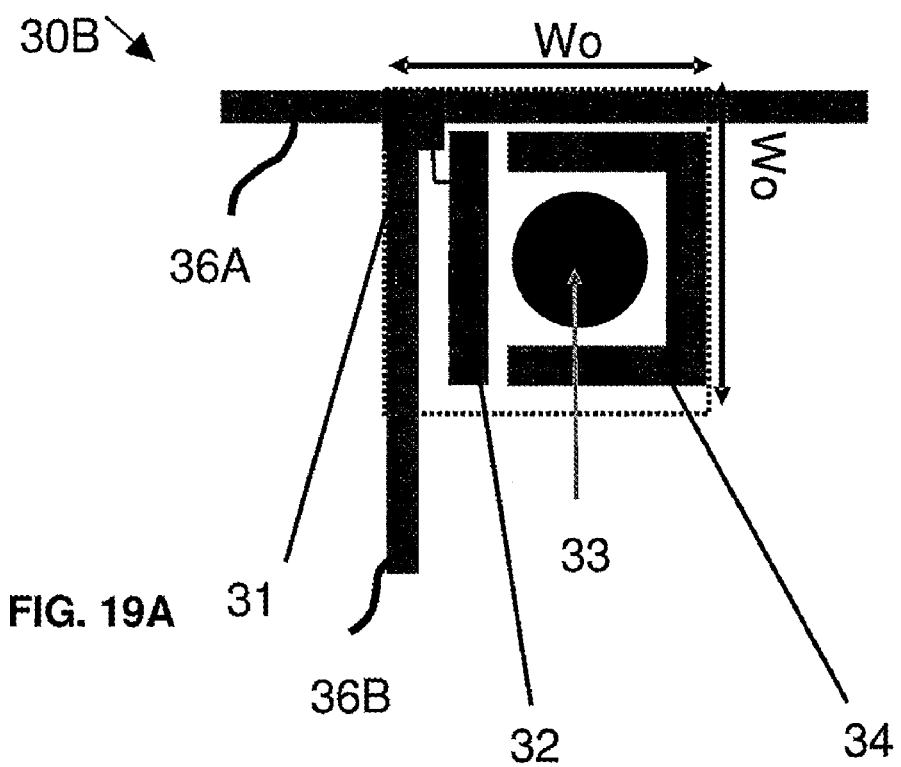
FIGS. 19A and 19B are schematic diagrams of an alternative embodiment of deflectors for a group deflector array or beam blanker array.
Figure 19B:
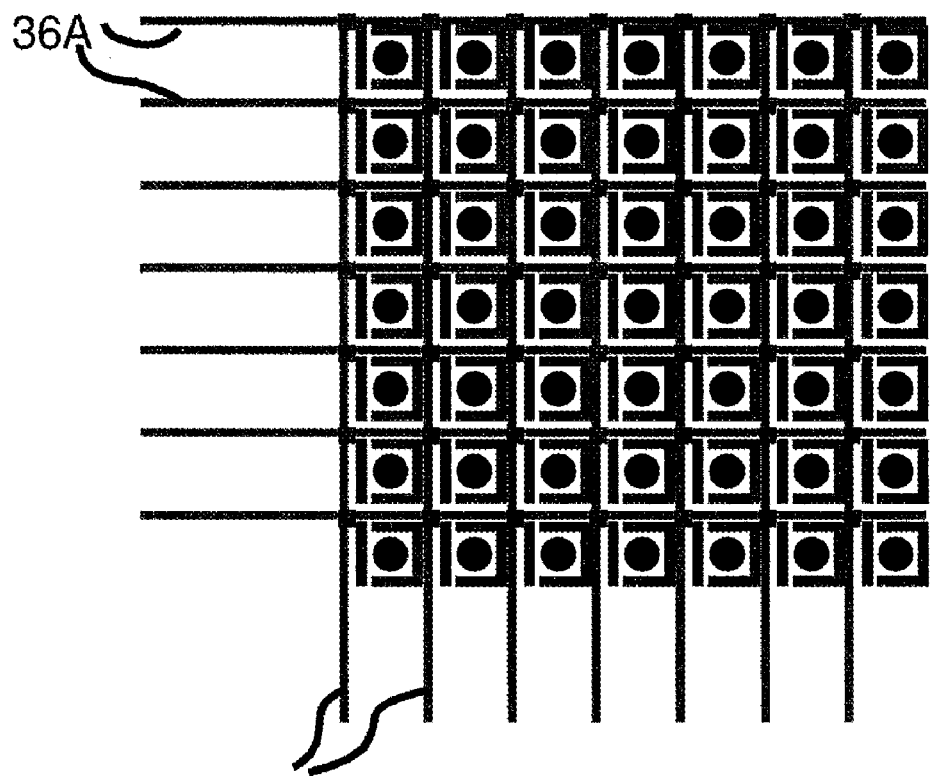

FIGS. 19A and 19B are schematic diagrams of an alternative embodiment of the group deflector array 6G and/or beam blanker array 6 of FIG. 3. FIG. 19A shows a single deflector 30B comprising one element of a beam blanker array 6 or group deflector array 6G. In this embodiment, the available space within the confinement of dimensions Wo by Wo is utilized to form a control line 36A and a transversely oriented control line 36B. A memory cell 31 is preferably formed at the intersection of these control lines. The memory cell can use a variety of known structures, and may be formed using techniques well known in the semiconductor industry. The memory cell is connected to switching electrode 32, so that an electrical signal stored in the memory cell will be applied to the switching electrode for as long as it remains in the memory cell.

FIG. 19B shows a portion of an array of the deflector elements 30B. The control lines are extended as vertical and horizontal conducting bus lines, preferably formed on the surface of the plate of the grouped deflector 6G using conventional lithography and etching techniques. In the example shown, a group of 7 by 7 deflectors will require a grid of 7 by 7 control lines, totaling 14 control lines. The control lines 36 preferably run in transverse directions towards relevant sides of the deflector group. Each memory cell in the array can be addressed by applying electrical signals to the bus lines for the corresponding row and column, using a bit-line and word-line addressing method as used in DRAM or other semiconductor memory technologies. The signal thus stored in each memory cell will control deflection of the beamlet passing through the aperture 33 corresponding to the memory cell.

Figure 20:
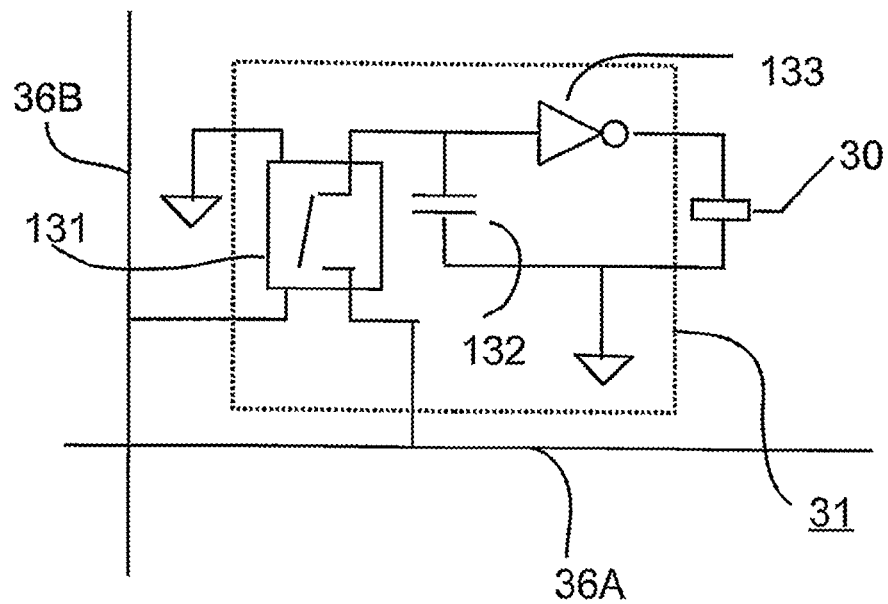
FIG. 20 is a circuit diagram of a memory cell connected to a deflector in a first embodiment.

FIG. 20 shows a circuit diagram of a portion of a deflection device as shown in FIG. 19A. This portion comprises a memory cell 31, which is connected to deflector 30. The memory cell 31 is located at the intersection of the first and second control lines 36A, 36B. It is preferably present within an array as shown in FIG. 19B. In this embodiment, the memory cell 31 comprises a storage element 132, a switching element 131 and an amplifier 133. The first control line 36A is herein a data line, i.e. a control line carrying control signals to be written into the storage element 132. The second control line 36B is herein a control line defining which memory cell 31 within the array is to written with fresh control signals.

The memory cell 30 operates in the following manner: when the second control line 36B provides a voltage to the switching element 131, this element 131 is closed. As a result, a control signal present on the first control line 36A passes through switching element 131 and is loaded into the storage element 132. Thereafter, the switching element 131 opens when the voltage on the second control line 36B is removed. The storage element 132 is a capacitor in this example, which is coupled between the output of switching element 131 and a ground line. The capacitor 132 may be a parasitic capacitor inherent in the amplifier 133, but it may be alternatively another type such as an intermetal capacitor or a MOS-transistor type capacitor. This type of storage element 132 results therein that the control signal is continuously provided to an input of the amplifier 133. The control signal is used in the amplifier 133 to either provide a deflection voltage to a switching electrode of the deflector 30. In one implementation, the amplifier 133 comprises an inverter. As long as the control signal read from the storage element 132 is sufficiently high, a deflection voltage will be provided onto the switching electrode of the deflector. This implementation turns out to have the advantage that the control signal read from the storage element 132 is effectively digitized. As a consequence, the amplifier 133 either provides a deflection voltage on the switching electrode or no deflection voltage at all. It is observed that the control signal outputted from the storage element 132 may have an analog profile due to current leakage.

Figure 21:
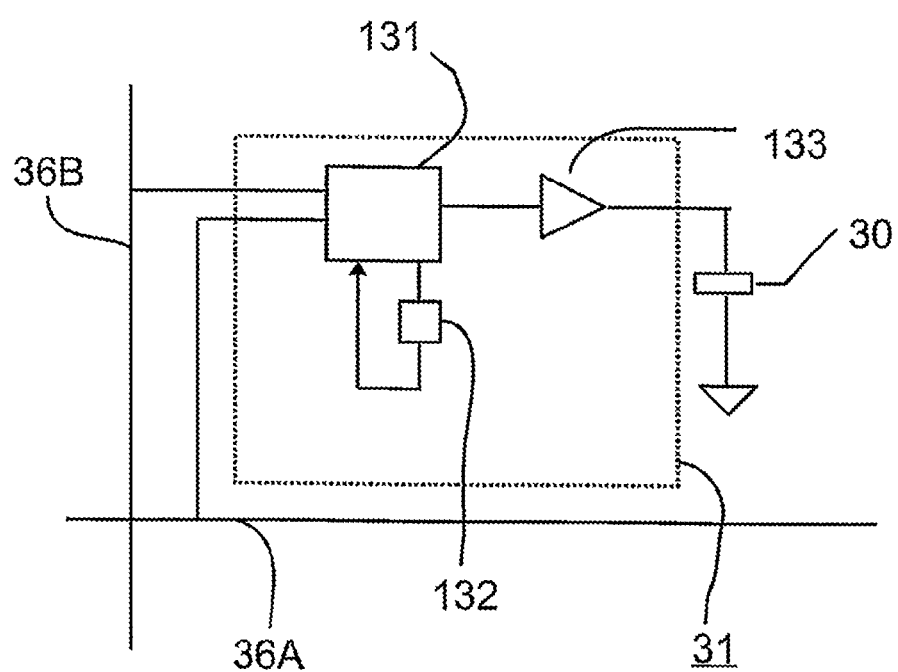
FIG. 21 is a circuit diagram of a memory cell connected to a deflector in a second embodiment.

FIG. 21 shows a circuit diagram of a portion of a deflection device as shown in FIG. 19A in an alternative configuration. The switching element 131 of this memory cell 30 is a larger circuit than in the configuration shown in FIG. 20. The storage element 132 in this embodiment is a flip-flip type element, SRAM, or the like. This element 132 is actively read out through the switching element 131. As in the configuration of FIG. 20, the memory cell 31 is provided at the intersection of control lines 36A and 36B. The signal provided by second control line 36B will be used to bring switching element 131 into a programming mode for loading a control signal into the storage element 132. After loading the control signal provided via control line 36A into the storage element 132, the switching element 131 is put back into a reading mode. In this reading mode, the control signal will be provided substantially continuously to the amplifier 133. That ensures that a deflection voltage will be provided on the deflector during a first blanking period, if the control signal obtained through control line 36A specifies so. This embodiment also has the advantage that the control signal read from the storage element 132 is effectively digitized, and is maintained throughout the first blanking period.

According to one aspect of the invention, the different deflectors 30 in the array as shown in FIG. 18B and FIG. 19B are deflected in different directions. This aspect is suitably applied in the group deflector array 6G, as shown in FIGS. 3 and 4. It is further suitably applied in the beamlet blanker 6.

The group deflector array 6G employs a group-wise arrangement of individual deflector elements with a non-uniform deflecting action. The beamlets are not deflected uniformly in a single direction, as by the sweeping or scanning deflector array 9 or beamlet blanker array 6. The beamlets within each group are deflected to a single point of convergence, and each group is directed towards a different point of convergence.

Figure 22:
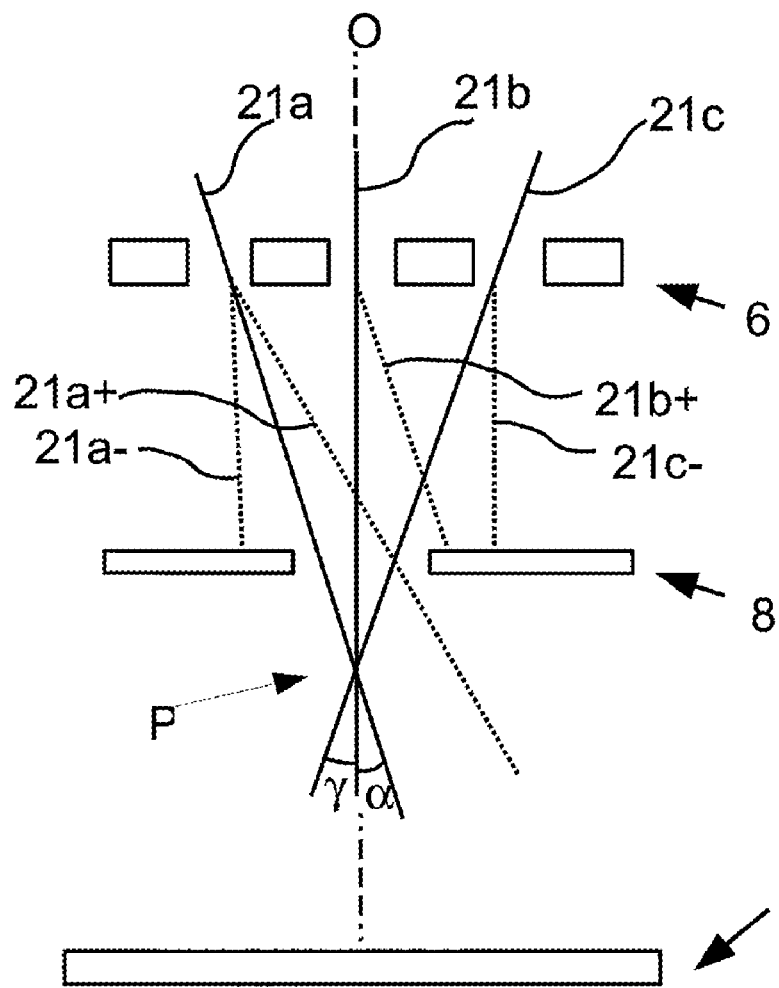
FIG. 22 is a schematic diagram of an embodiment of a deflector.

FIG. 22 explains in more detail the concepts of deflection 'backwards' and 'further forwards' enabled by the invention.

Figure 23:
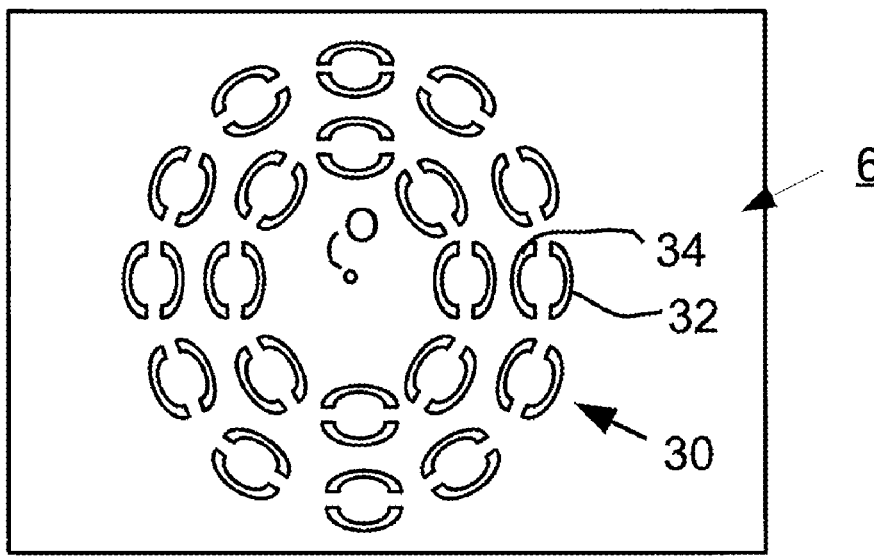
FIG. 23 is a schematic cross-sectional diagram of an array of deflectors.

FIG. 23 shows a configuration of deflectors feasible for deflection to a single point of convergence.

FIG. 22 shows a schematic diagram of a blanker according to the invention. It is more precisely a cross-sectional drawing in a vertical plane extending through the blanker. The blanker comprises a blanker array 6 with a plurality of apertures, and a beam stop array 8. For sake of reference the target 11 has also been indicated. The figure is not drawn to scale. For sake of clarity, only a section of the array is indicated, including apertures for beamlets 21a, 21b and 21c. These beamlets 21a, 21b, 21c form part of one group. The present blanker is designed for a system comprising a beamlet manipulator for converging groups of beamlets 21a, 21b, 21c towards a common point of convergence P for each group. This common point of convergence P is located on an optical axis O for the group of beamlets 21a, 21b, 21c. As a result of beam manipulating in the beam manipulator, the beamlets 21a, 21c are converging. These beamlets 21a, 21c have an incident angle $\alpha$, $\beta$ extending between the beamlet ray and the optical axis O. The dashed lines 21a−, 21a+, 21b+, 21c− show orientations of the beamlets 21a, 21b, 21c, when these beamlets are deflected in the blanking deflectors of the blanking array 6. Beamlet 21c is herein deflected backwards into orientation 21c−; that is its incident angle $\gamma$ is reduced by the operation of the blanking deflector. Beamlet 21b is effectively deflected forwards into direction 21b+. Therewith, beamlets 21b and 21c are deflected in mutually opposite directions, at least in the plane of this figure. For beamlet 21a, two deflection directions are shown, the backwards direction 21a− and the further forward direction 21a+. In this example, the further forward direction 21a+ passes the beam stop array 8 and is therefore not appropriate. This is however the result of the specific example shown in this FIG. 22.

FIG. 23 shows a schematic view of one embodiment of the blanker array 6. As stated above, this array may alternatively be the group deflector array 6G. This view shows a radial arrangement of the individual deflectors 30 around a centrally located optical axis O. Such an orientation is most suitable in combination with an optical system wherein all beamlets of a group passing through the blanker array 6 are converged to a common point of convergence on the optical axis O. In this embodiment, the electrodes 32, 34 of the individual deflectors 30 are rotated, such that when deflected, the beamlets are still directed along lines converging to points of convergence on the optical axis. This deflection along radial lines turns out to be beneficial to prevent any disturbance of other beamlets and/or any undesired passing of deflected beamlets through the beam stop. As the lateral distances between beamlets and also between groups of beamlets are small in comparison to the vertical distance between beamlet blanker array 6 and beam stop array 8, such disturbance and/or undesired passing can be significant. Although this FIG. 23 suggests an area without deflectors 30 in the vicinity of the optical axis O, that is not a necessary feature of the embodiment.

FIG. 23 shows a further aspect of the invention in that the deflectors 30 comprise at least one concave electrode 32, 34. Suitably, as in this embodiment, both electrodes 32, 34 have a concave shape. Although not indicated herein, apertures extend through the blanker array 6 between the electrodes 32, 34. The concave shape results in the electrodes 32, 34 having a shape that is conformal to cylindrical apertures. This cylindrical aperture shape is in itself suitable for preventing the introduction of certain optical aberrations, such as astigmatism.

In alternative embodiment, the group deflector array 6G and beam blanker array 6 may be combined into one integrated unit. In this embodiment, the combined group deflector/blanker operates to deflect the unblanked beamlets in each group to a particular opening in beam stop array 8, while deflecting the beamlets to be blanked in each group somewhat more strongly (or weakly or in a altered direction) so that they strike the beam stop array 8, preferably near the relevant opening for the group of beamlets. The group deflector/blanker could be set so that it would blank beamlets if no signal is applied and concentrate beamlets towards the end module when a signal is applied. However, this would require maintaining a certain voltage potential on the signal lines of the combined group deflector/blanker to maintain continued deflection for a group of beamlets. Thus it is preferred to have the group deflector array 6G and beam blanker array 6 constructed as separately controlled arrays, but preferably arranged in close proximity to each other. This permits an arrangement where an easily maintained ground voltage is applied on control lines to the beam blanker in order to let beamlets through (i.e. a "normally off" beam blanker array), and the group deflector that is maintained at a particular single voltage to maintain deflection of the groups of beamlets through the projection lens systems.

FIG. 4 illustrates an alternative to the embodiment of FIG. 3, including the group deflector array 6G and additionally including a shaping aperture array 18. The shaping aperture array 18 preferably comprises one or more plates or substrates having shaped apertures formed in them at locations corresponding to the apertures in arrays 4, 5, 6G and 6. The shaping aperture array 18, similarly to the other arrays, is preferably made of silicon or other semiconductor material and the apertures are preferably formed using lithography and etching techniques, and these techniques are preferably controlled sufficiently precisely to ensure uniformity in the position, size, and shape of the apertures. The apertures in shaping aperture array 18 may be round, square, or other shape. The shaping aperture array 18 may be coated with a surface layer of a metal to prevent surface charging, and in one embodiment the metal is of a type which does not form a native-oxide skin layer, such as CrMo.

These apertures operate to shape each beamlet, by cutting off a peripheral portion of the beamlets striking the apertures. The resulting shaped beamlet will exhibit a more uniform dose distribution. The shaping aperture array 18 allows imaging of the apertures rather than of a virtual image of the beam source 1. With this addition, the system becomes less dependent on the position and magnitude of the spots created by focusing the beamlets on the plane of beam blanker array 6. This results in the system being less susceptible to variations or errors in the array of lens systems preceding the beam blanker array 6. However, the system thereby becomes more susceptible to variations in the dose of the beamlets.

The shaping aperture array 18 is preferably positioned in close vicinity to the beam blanker array 6, either before or preferably after array 6, and it may be used in a system without the group deflector array 6G.

FIG. 5 illustrates yet another embodiment of the same principle illustrated in the systems of FIGS. 3 and 4. In this embodiment, the aperture array 4 is manufactured to produce larger sub-beams 20A. The sub-beams 20A are demagnified by a first condenser lens array 5A focusing the sub-beams onto a common plane 19 and producing a cross-over per sub-beam at plane 19. A second condenser lens array 5B, located preferably immediately behind plane 19, produces focused sub-beams 20B focused towards the end module 7. It should be noted that the various condenser lens arrays in any of the embodiments may comprise a single condenser lens array or a set of condenser lens arrays, as would be known to a person of skill in the field of electron-optics.

The sub-beams 20B are intercepted by a shaping aperture array 18, which in this embodiment produces a plurality of projection beamlets 21 from each sub-beam 20B. These beamlets 21 pass through beamlet blanker array 6, the blanked beamlets being blocked by beam stop array 8. The unblanked beamlets in each group pass through a corresponding opening in beam stop array 8 and are subsequently projected onto the target by projection lens arrangement 10.

The embodiment shown in FIG. 5 has the advantage that the combination of lens 5A and 5B can be a rather weak lens (allowing for a relative long distance between condenser lens array 5B and end module 7) while lenses 5A and 5B individually can be rather strong. Lenses 5A and 5B are strong if, for example, beamlet energy is reduced between condenser lens array 5B and end module 7, which is beneficial for the strength of beamlet blanker 6. In another embodiment an array of apertures is placed at plane 19 to provide yet another degree of freedom to control the opening angle of beamlets 20B.

FIG. 6 illustrates yet another embodiment, being a variation of the system of FIG. 5 in which the sub-beams 20A are directly focused by condenser lens array 5 towards the end module 7. Compared to the embodiment of FIG. 5, this embodiment has the advantage of fewer components (omitting the extra condenser lens array 5B), a somewhat shorter column length, and less chromatic aberration due to absence of cross-over in the sub-beams 20A. However, this embodiment lacks the advantage of the embodiment of FIG. 5 of increased freedom in determining the opening angle of the sub-beams.

Figure 7:
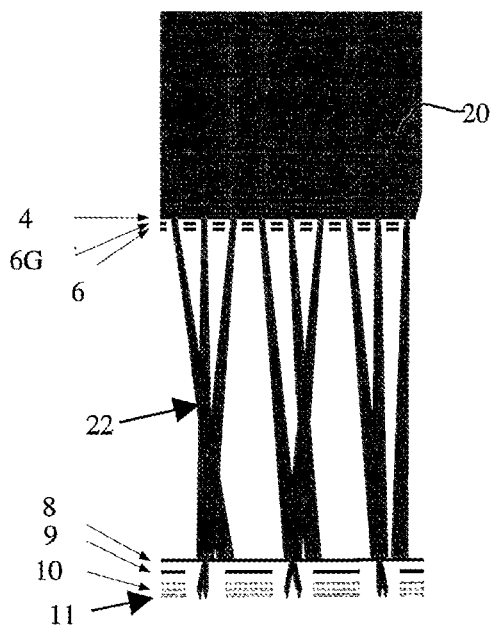
FIG. 7 is a simplified embodiment including a group deflection array.

FIG. 7 illustrates in an even more simplified version of the system, comprising an aperture array 4, immediately followed up by a group deflector array 6G and a beamlet blanker array 6, or vice versa.

Figure 8:
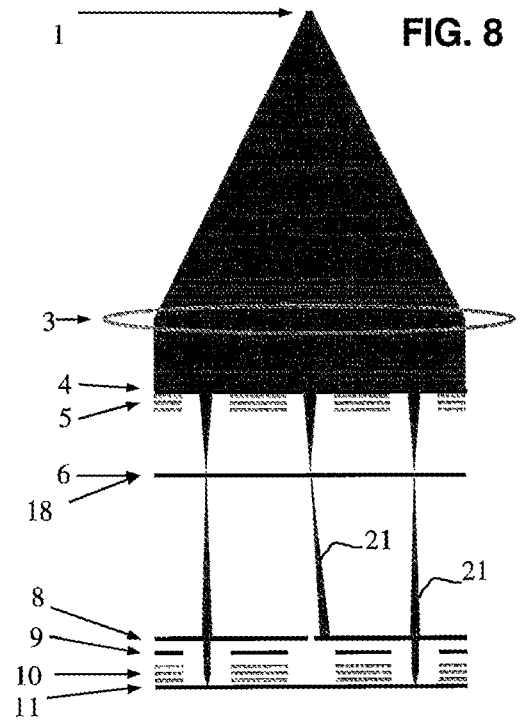
FIGS. 8 to 10 are alternative embodiments of the embodiments of FIG. 4 for a single beamlet per projection lens.
Figure 9:
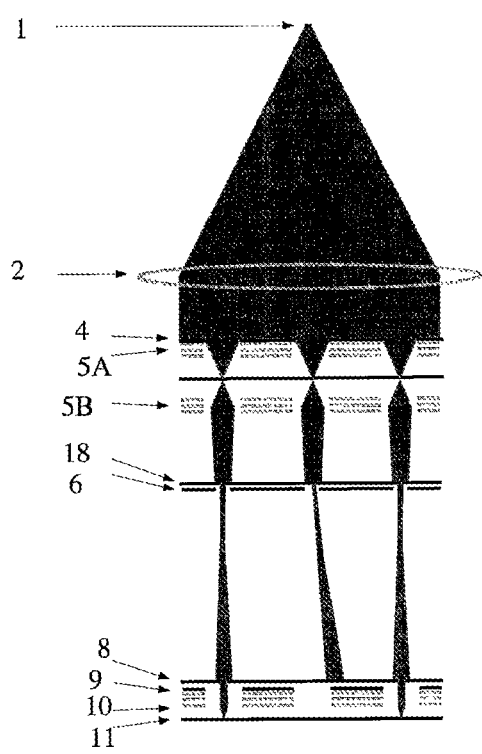
Figure 10:
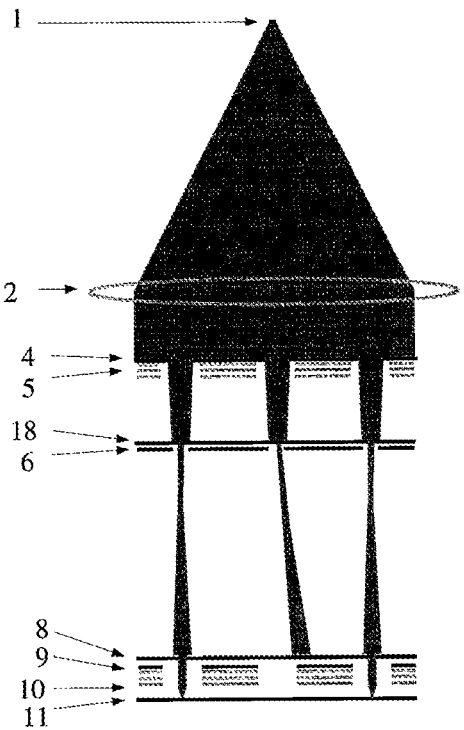

FIGS. 8 to 10 illustrate various alternative embodiments with non-patterned beamlets, i.e. single beamlet per projection lens systems. FIG. 8 comprises the system as shown in FIG. 1 with the addition of a shaping aperture array 18 located in the vicinity of (before or after) beamlet blanker array 6. FIG. 9 comprises the system as shown in FIG. 5 with the two condenser lens arrays 5A and 5B focusing sub-beams 20A and 20B respectively. However, only a single beamlet 21 is formed by shaping aperture array 18 from each sub-beam 20B. FIG. 10 comprises the system as shown in FIG. 6 with a single condenser lens arrays 5 focusing sub-beams 20A onto the end module 7. However, only a single beamlet 21 is formed by shaping aperture array 18 from each sub-beam 20A.

FIG. 12 illustrates yet another embodiment with aperture array 4A for creating sub-beams 20A and aperture array 4B for creating beamlets 21. A condenser lens array 5 (or a set of condenser lens arrays) is included behind sub-beam creating aperture array 4A, for focusing the sub-beams 20A towards a corresponding opening in the beam stop array 8 of end module 7. Beamlet creating aperture array 4B is preferably included in combination with a beamlet blanker array 6, i.e. arranged close together with array 4B before array 6 or the other way around.

As separately shown in FIG. 12A, the condenser lens or lenses 5 focus sub-beam 20A either in or towards a corresponding opening in beam stop array 8 of end module 7. In this example, the aperture array 4B produces three beamlets from sub-beam 20A, which strike the beam stop array 8 at a corresponding opening so that the three beamlets are projected onto the target by the projection lens system in end module 7. In practice a much larger number of beamlets may be produced by aperture array 4B for each projection lens system in end module 7. In a practical embodiment typically around 50 beamlets may be directed through a single projection lens system, and this may be increased to 200 or more. As shown in FIG. 12B, the beamlet blanker array 6 may deflect individual beamlets 21 in a group of beamlets at certain times in order to blank them. This is illustrated by blanked beamlet 22, which has been deflected to a location on the beam stop array 8 near to but not at an opening.

In a non-depicted variation of the FIG. 12 embodiment, the aperture plates 4A and 4B are preferably integrated in an integrated aperture plate 4AB for producing groups of beamlets 21. The condenser lens array 5 is preferably located behind the integrated aperture plate 4AB. This design advantageously provides a simple and economic means for realizing a multiple beamlet per projection lens system.

Figure 14:
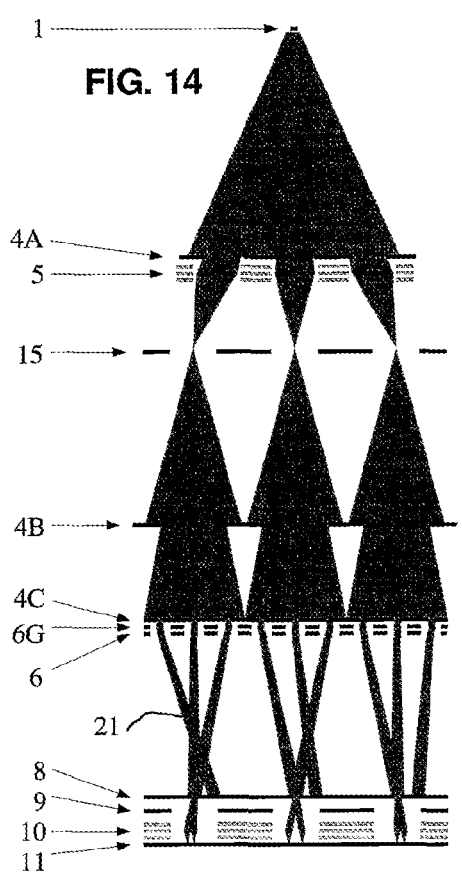
FIG. 14 and FIG. 15 are further embodiments allowing the use of unmodified or relatively simple source and projection lens systems.
Figure 15:
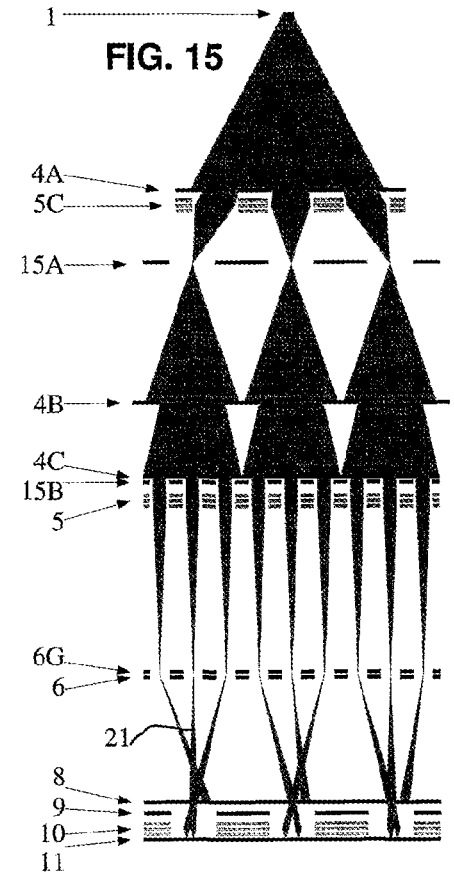

FIGS. 14 and 15 are schematic diagrams of systems designed to reduce problems of chromatic aberration of the collimator 3. One solution is to apply the technology as disclosed by US published patent application 2004/232349 of the Applicant of the present application, which is hereby incorporated by reference in its entirety. According to this solution, a lens array is included in the system between the source 1 and the collimator 3, to focus sub-beams in the main plane of collimator 3. A first effect of this measure is that the chromatic aberration of the collimator does not result in a blur of the virtual source. Instead, a "top hat" opening angle is convoluted with an aberration angle. A second effect is that if the sub-beams are imaged in the collimator main plane with sufficient demagnification, the opening angle is large, and thus the aberration angle is small with respect to the opening angle. The unusable or at least unfavorable angles can then be removed by an aperture down stream.

FIG. 14 illustrates a solution in which the virtual source is imaged on the target, using a single condenser lens array 5. This condenser lens array 5 is included within a diverging beam part, in close proximity to and behind a first aperture array 4A. The focused sub-beams thus created are projected on to a main plain of a collimator array 15, from where the sub-beams diverge in a collimated manner, here with parallel central axes, to a second aperture array 4B. The second aperture array 4B is constructed and/or located to truncate a peripheral part of the collimated sub-beams. A central part of these collimated sub-beams, showing a mostly uniform current distribution, continues to a third aperture array 4C, which finally creates beamlets 21 to be projected on the target 11 (unless blanked by beamlet blanker array 6). A group deflector array 6G and beamlet blanker array 6 is located behind the final aperture array 4C as described before, for directing groups of beamlets created by the final aperture array towards end module 7.

FIG. 15 illustrates an alternative to FIG. 14, including a more complex arrangement using two condenser arrays (5C and 5) and two collimator arrays (15A and 15B) but providing an improvement in overall transmission performance. Beamlets as created in an upper system part corresponding to that of FIG. 14, are subsequently collimated by collimator array 15B, so that the plurality of beamlets 21 created by the final aperture array 4C become parallel, i.e. the central axes of the beamlets become parallel. The collimated beamlets generated by final aperture array 4C and collimator array 15B are focused by condenser lens array 5, preferably located behind the collimator array 15B. Group deflector array 6G, followed by or preceded by beamlet blanker array 6, is located within or close to the focal plane of the focused and collimated beamlets.

Figure 16:
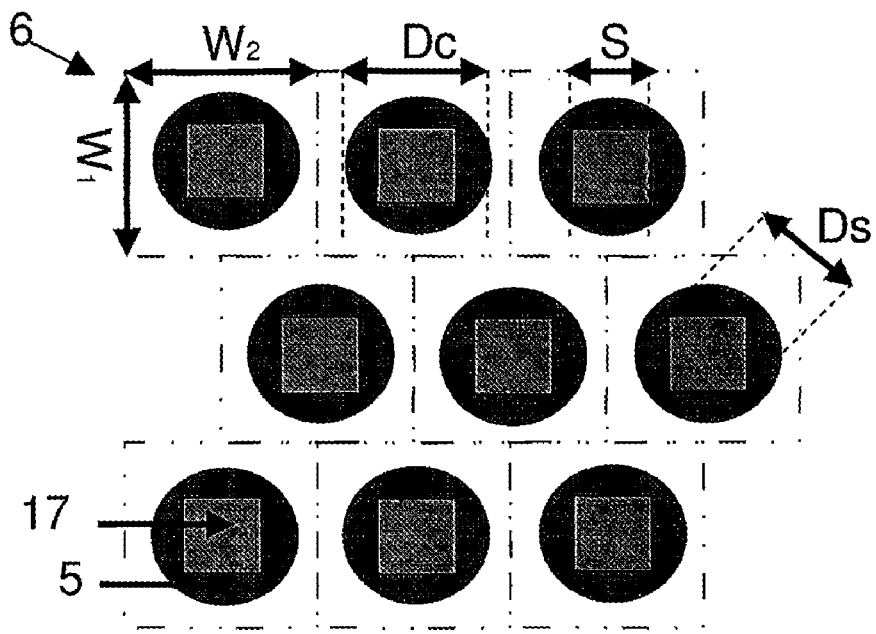
FIG. 16 is diagram showing a possible layout for a beamlet blanker array 6.
Figure 17:
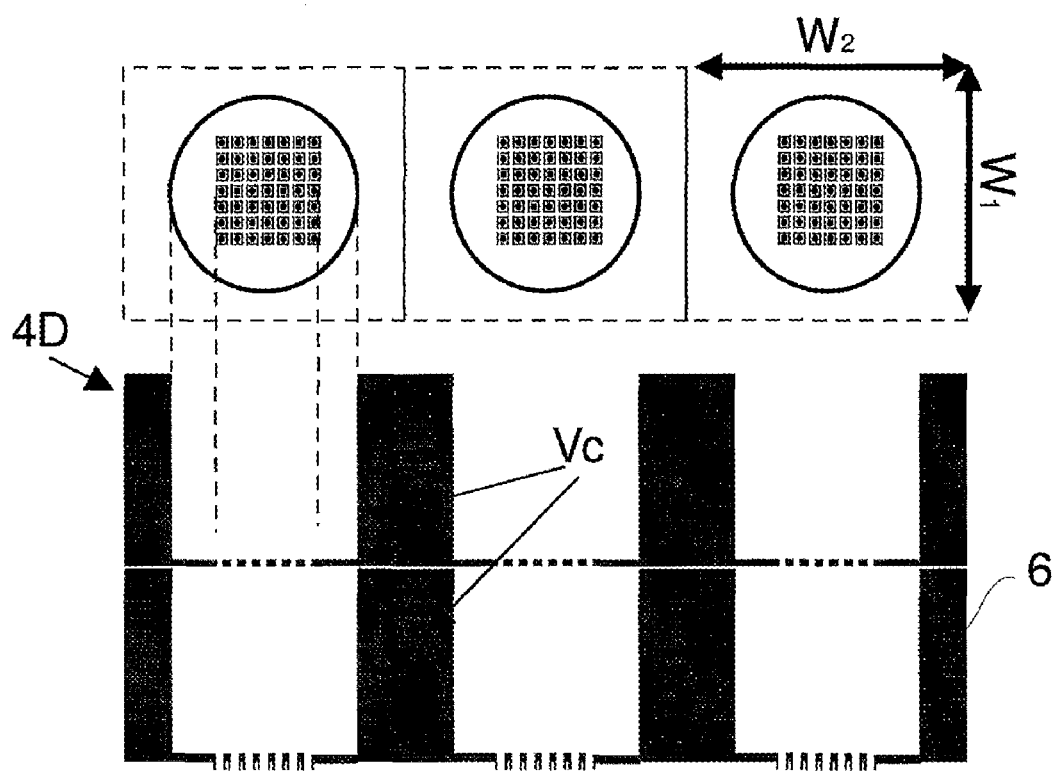
FIG. 17 illustrates an aperture array combined with a beamlet blanker array 6.

Certain additional aspects of the arrays used in the preceding embodiments are illustrated in FIGS. 16 and 17. FIG. 16 is diagram showing a possible layout for a beamlet blanker array 6, with an offset row or triangular arrangement of array apertures. The apertures in the condenser lens arrays, and the group deflector arrays in the various embodiments would also conform to this same arrangement, which directly corresponds to or mirrors the arrangement of the projection lens systems in the end module 7 in the so called projection slit of the system.

A deflector area 17 of a beamlet blanker array 6 is shown, indicated with a location relative to an aperture of a condenser lens array 5 preceding or following the blanker array, e.g. as in FIG. 12. Since in the present embodiments the condenser lenses are arranged typically with a very high filling factor, here around 80%, a sub beam aperture as in aperture array 4A in FIGS. 12, 12A and 12B, or the circular opening of an integrated aperture array 4D as in FIG. 17, would only be slightly smaller than that of condenser lens diameter Dc as projected here in combination with a blanker array 6. In this example the condenser lens opening has a diameter of 100 μm. The maximum deflector area 17 in this arrangement is determined by sides S of 56 μm by 56 μm, leading to a diametric or encircled measurement Ds of approximately 79 μm. For a 22 nm technology node, a reasonable number of pixels in a virtual grid for positioning the spots of the system could be 49, or 7 by 7, while geometric diameter of the spot size would be 24 nm, and a typical amount of demagnification at the projection lens system of end module 7 could, according to an embodiment here exemplified, be a factor of 100. With the triangular positioning of the beamlets in the system, the pitch of the available area to locate e.g. a blanker deflector is typically an area of W1 by W2, where in this example W1 is 130 μm and W2 is 150 μm. A practical number of beamlets per lens, alternatively denoted spots or sub-beamlets per patterned beamlet, could however amount to 200 or more. In practice this number is made 196 beamlets, arranged in an array of 14 by 14 beamlets.

FIG. 17 illustrates a preferred combination of an integrated aperture array 4D with a beamlet blanker array 6. The upper portion of FIG. 17 shows a top view of the integrated aperture array 4D. The integrated aperture array is designed with the same dimension constraints as the beamlet blanker array 6 in FIG. 16, with a field of dimensions W1 by W2. Each field comprises a field of 49 beamlet apertures, which are schematically represented in groups of 7 by 7. The lower portion of FIG. 17 shows a side view of the integrated aperture array 4D and beamlet blanker array 6. Both the integrated aperture array 4D and the beamlet blanker array 6 are according to further preference constructed with a thick plate provided with a single large aperture for each group of beamlets, and a thin array plate having multiple smaller apertures for each individual beamlet in each group. These thick and thin plates may either be two separate, connected plates, or a single plate in which the large apertures are first formed, followed by the small apertures. The large apertures preferably form vertical walls Vc surrounding the group of smaller apertures, the large aperture and group of smaller apertures preferably arranged coaxially as shown.

The thin array plate for the beamlet blanker array 6 includes the switching or blanker electrodes. The beamlet rendering apertures of array 4D are slightly smaller than the apertures of the beamlet blanker array 6. In accordance with a further embodiment of the invention, the aperture array 4D and beamlet blanker array 6 are integrated in a single array. This further integration has the advantage of a further reduction of the number of optical elements within the system column, but has the disadvantage that it is more difficult to manufacture while maintaining the highly precise and highly uniform apertures of an integrated aperture array.

The invention has been described by reference to certain embodiments discussed above. It will be recognized that these embodiments are susceptible to various modifications and alternative forms well known to those of skill in the art without departing from the spirit and scope of the invention. Accordingly, although specific embodiments have been described, these are examples only and are not limiting upon the scope of the invention, which is defined in the accompanying claims.

What is claimed is:

1. A charged particle multi-beamlet lithography system for exposing a target using a plurality of beamlets, the system comprising:
    a beam generator for generating a plurality of charged particle beamlets;
    a beamlet blanker for patterning said beamlets; and
    a beamlet projector for projecting said patterned beamlets onto the target surface;
    said system comprising a deflection device, the deflection device comprising a plurality of memory cells, wherein each memory cell is provided with a storage element and is connected to a switching electrode of a deflector.

2. The system as claimed in claim 1, wherein the memory cell comprises at least one switching element for loading a signal into said storage element.

3. The system as claimed in claim 1, wherein said plurality of memory cells is organized in an addressable array.

4. The system as claimed in claim 3, wherein said memory cells are provided at an intersection of a first and a second control line.

5. The system as claimed in claim 3, said array further comprising a voltage supply channel and/or a clock distribution channel.

6. The system as claimed in claim 1, wherein the loading of said storage element is controlled by a control unit, wherein signals from said control unit are optically transmitted to light sensitive elements in the deflection device.

7. The system as claimed in claim 1, wherein an intermediate memory is present for temporary storage of a plurality of said signals.

8. The system as claimed in claim 1, wherein at least one of the electrodes of said deflector has a concave shape.

9. The system as claimed in claim 1, wherein a first and a second deflector of different memory cells are arranged for deflecting in mutually different directions.

10. The system as claimed in claim 9, wherein the deflection directions of said first and second deflectors are opposite directions.

11. The system as claimed in claim 1, wherein the beamlet has an incident angle to said deflection device, said incident angle defined in comparison to a normal to the deflection device, wherein said deflector deflects the beamlet further forward, thus increasing said incident angle.

12. The system as claimed in claim 11, wherein a second beamlet is deflected backward, thus reducing the incident angle of said second beamlet.

13. A method of deflecting at least one charged particle beamlet, comprising the steps of:
    transmitting a control signal to a deflector; and
    deflecting the beamlet on the basis of said control signal;
    wherein said control signal is transmitted to a storage element of a memory cell that is connected to said deflector.

14. The method as claimed in claim 13, further comprising periodically transmitting the control signal to said storage element.

15. The method as claimed in claim 13, further comprising continuously providing said control signal from said storage element during a control period.

16. The method as claimed in claim 13, further comprising amplifying the control signal in the storage element and providing the amplified control signal as a driving voltage to a switching electrode of the deflector.

17. The method as claimed in claim 16, wherein the amplifier comprises an inverter for evaluating said control signal, said amplifier having a digital output.

18. The method as claimed in claim 13, wherein said control signal is optically transmitted from a control unit to a light sensitive element that is electrically coupled to said memory cell.

19. A method of transferring a pattern to a target surface using at least one charged particle beamlet, comprising the steps of:
    generating the at least one charged particle beamlet;
    deflecting said beamlets according to a predefined modulation pattern so as to pattern the beamlets; and
    projecting said patterned beamlets to the target surface, wherein the deflection step is carried out as claimed in claim 14.

* * * * *